(12) United States Patent
Dasgupta et al.

(10) Patent No.: US 10,388,777 B2
(45) Date of Patent: Aug. 20, 2019

(54) HETEROEPITAXIAL STRUCTURES WITH HIGH TEMPERATURE STABLE SUBSTRATE INTERFACE MATERIAL

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Beaverton, OR (US); Sanaz K. Gardner, Portland, OR (US); Seung Hoon Sung, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/574,817

(22) PCT Filed: Jun. 26, 2015

(86) PCT No.: PCT/US2015/038096
§ 371 (c)(1),
(2) Date: Nov. 16, 2017

(87) PCT Pub. No.: WO2016/209283
PCT Pub. Date: Dec. 29, 2016

(65) Prior Publication Data
US 2018/0145164 A1 May 24, 2018

(51) Int. Cl.
*H01L 29/66* (2006.01)
*H01L 29/778* (2006.01)
(Continued)

(52) U.S. Cl.
CPC ...... *H01L 29/7786* (2013.01); *H01L 21/0262* (2013.01); *H01L 21/02381* (2013.01);
(Continued)

(58) Field of Classification Search
CPC .................................................. H01L 21/02381
See application file for complete search history.

(56) References Cited

U.S. PATENT DOCUMENTS 5,367,183 A 11/1994 Perea et al.
6,121,153 A 9/2000 Kikkawa
(Continued)

FOREIGN PATENT DOCUMENTS

EP 1054442 11/2000
JP 11260835 9/1999
(Continued)

OTHER PUBLICATIONS

International Search Report and Written Opinion for International Patent Application No. PCT/US15/38096, dated Feb. 23, 2016.
(Continued)

*Primary Examiner* — Thao P Le
(74) *Attorney, Agent, or Firm* — Green, Howard & Mughal LLP

(57) ABSTRACT

Crystalline heterostructures including an elevated crystalline structure extending from one or more trenches in a trench layer disposed over a crystalline substrate are described. In some embodiments, an interfacial layer is disposed over a silicon substrate surface. The interfacial layer facilitates growth of the elevated structure from a bottom of the trench at growth temperatures that may otherwise degrade the substrate surface and induce more defects in the elevated structure. The trench layer may be disposed over the interfacial layer with a trench bottom exposing a portion of the interfacial layer. Arbitrarily large merged crystal structures having low defect density surfaces may be overgrown from the trenches. Devices, such as III-N transistors, may be further formed on the raised crystalline structures while
(Continued)

silicon-based devices (e.g., transistors) may be formed in other regions of the silicon substrate.

25 Claims, 15 Drawing Sheets

(51) Int. Cl.
    *H01L 29/06*     (2006.01)
    *H01L 29/20*     (2006.01)
    *H01L 21/02*     (2006.01)
    *H01L 21/8258*     (2006.01)
    *H01L 27/085*     (2006.01)
    *H01L 21/04*     (2006.01)
    *H01L 29/78*     (2006.01)

(52) U.S. Cl.
    CPC .. *H01L 21/02458* (2013.01); *H01L 21/02639* (2013.01); *H01L 21/0445* (2013.01); *H01L 21/8258* (2013.01); *H01L 27/085* (2013.01); *H01L 29/0657* (2013.01); *H01L 29/2003* (2013.01); *H01L 29/66462* (2013.01); *H01L 21/0254* (2013.01); *H01L 21/02439* (2013.01); *H01L 29/785* (2013.01)

(56) References Cited

U.S. PATENT DOCUMENTS

| | | | |
|---|---|---|---|
| 6,225,196 B1 | 5/2001 | Yokoyama | |
| 6,261,929 B1 | 7/2001 | Gehrke et al. | |
| 6,608,327 B1* | 8/2003 | Davis | H01L 21/0237 257/103 |
| 6,617,668 B1 | 9/2003 | Koide et al. | |
| 7,952,150 B1 | 5/2011 | Wohlmuth | |
| 8,173,551 B2 | 5/2012 | Bai et al. | |
| 8,530,978 B1 | 9/2013 | Chu et al. | |
| 8,569,769 B2 | 10/2013 | Hwang et al. | |
| 8,629,477 B2 | 1/2014 | Lochtefeld et al. | |
| 9,000,485 B2 | 4/2015 | Lee et al. | |
| 9,117,777 B2 | 8/2015 | Vincent et al. | |
| 9,153,583 B2 | 10/2015 | Glass et al. | |
| 9,196,709 B2* | 11/2015 | Lee | H01L 29/66795 |
| 9,240,410 B2 | 1/2016 | Then et al. | |
| 2001/0040246 A1 | 11/2001 | Ishii | |
| 2002/0110989 A1 | 8/2002 | Yamaguchi et al. | |
| 2002/0152952 A1 | 10/2002 | Beaumont | |
| 2003/0045017 A1 | 3/2003 | Hiramatsu et al. | |
| 2004/0029365 A1 | 2/2004 | Linthicum et al. | |
| 2004/0169192 A1* | 9/2004 | Kato | H01L 21/0237 257/103 |
| 2006/0084245 A1* | 4/2006 | Kohda | H01L 21/0237 438/478 |
| 2006/0124962 A1 | 6/2006 | Ueda et al. | |
| 2006/0181828 A1 | 8/2006 | Sato | |
| 2006/0197129 A1 | 9/2006 | Wohlmuth | |
| 2007/0045670 A1 | 3/2007 | Kuraguchi | |
| 2007/0278507 A1 | 12/2007 | Nakazawa et al. | |
| 2008/0036038 A1 | 2/2008 | Hersee et al. | |
| 2008/0070355 A1* | 3/2008 | Lochtefeld | H01L 21/823412 438/172 |
| 2008/0093622 A1 | 4/2008 | Li | |
| 2008/0099785 A1 | 5/2008 | Bai | |
| 2008/0197358 A1 | 8/2008 | Frahm et al. | |
| 2009/0039361 A1* | 2/2009 | Li | H01L 21/02381 257/94 |
| 2009/0267078 A1 | 10/2009 | Mishra et al. | |
| 2010/0012976 A1 | 1/2010 | Hydrick et al. | |
| 2010/0012977 A1 | 1/2010 | Derluyn et al. | |
| 2010/0068866 A1* | 3/2010 | Yu | H01L 21/0237 438/429 |
| 2010/0072576 A1 | 3/2010 | Arena | |
| 2010/0140735 A1 | 6/2010 | Bommena et al. | |
| 2010/0207138 A1 | 8/2010 | Nakahata et al. | |
| 2010/0213511 A1 | 8/2010 | Lochtefeld | |
| 2010/0219452 A1 | 9/2010 | Brierley | |
| 2010/0270559 A1 | 10/2010 | Ota | |
| 2011/0117726 A1* | 5/2011 | Pinnington | H01L 21/02389 438/458 |
| 2011/0210377 A1 | 9/2011 | Haeberlen et al. | |
| 2011/0272740 A1 | 11/2011 | Umeda et al. | |
| 2011/0278945 A1 | 11/2011 | Wheatley, III et al. | |
| 2012/0119218 A1 | 5/2012 | Su et al. | |
| 2012/0119220 A1 | 5/2012 | Guo et al. | |
| 2012/0248500 A1 | 10/2012 | Kajitani | |
| 2012/0292789 A1 | 11/2012 | Sazawa | |
| 2012/0305992 A1 | 12/2012 | Marino et al. | |
| 2013/0015460 A1 | 1/2013 | Chen et al. | |
| 2013/0015525 A1 | 1/2013 | Cheng | |
| 2013/0043468 A1 | 2/2013 | Adekore | |
| 2013/0043485 A1 | 2/2013 | Ueno | |
| 2013/0049013 A1 | 2/2013 | Shimada | |
| 2013/0105810 A1 | 5/2013 | Nishimori et al. | |
| 2013/0221409 A1 | 8/2013 | Nakajima et al. | |
| 2013/0228809 A1 | 9/2013 | Chang et al. | |
| 2013/0270579 A1 | 10/2013 | Yu et al. | |
| 2013/0271208 A1 | 10/2013 | Then et al. | |
| 2013/0277686 A1 | 10/2013 | Liu et al. | |
| 2013/0307513 A1 | 11/2013 | Then et al. | |
| 2013/0313561 A1 | 11/2013 | Suh | |
| 2013/0320353 A1 | 12/2013 | Kryiouk et al. | |
| 2013/0334538 A1 | 12/2013 | Saunier | |
| 2014/0014966 A1 | 1/2014 | Tabatabaie et al. | |
| 2014/0042446 A1 | 2/2014 | Chiang | |
| 2014/0084300 A1 | 3/2014 | Okamoto | |
| 2014/0091308 A1 | 4/2014 | Dasgupta et al. | |
| 2014/0091310 A1 | 4/2014 | Jeon et al. | |
| 2014/0091398 A1 | 4/2014 | Hata et al. | |
| 2014/0091845 A1 | 4/2014 | Then et al. | |
| 2014/0094223 A1 | 4/2014 | Dasgupta et al. | |
| 2014/0110759 A1 | 4/2014 | Murata et al. | |
| 2014/0239312 A1 | 8/2014 | Shatalov et al. | |
| 2014/0252368 A1 | 9/2014 | Lee et al. | |
| 2014/0264321 A1 | 9/2014 | Liang | |
| 2014/0264379 A1 | 9/2014 | Kub et al. | |
| 2014/0264380 A1 | 9/2014 | Kub et al. | |
| 2015/0014820 A1 | 2/2015 | Renaud | |
| 2015/0041820 A1 | 2/2015 | Renaud | |
| 2015/0041860 A1 | 2/2015 | Nishimori et al. | |
| 2015/0061075 A1* | 3/2015 | Yeh | H01L 21/76877 257/532 |
| 2015/0061078 A1 | 3/2015 | Abel et al. | |
| 2015/0103977 A1 | 4/2015 | Ono et al. | |
| 2015/0115325 A1 | 4/2015 | Vielemeyer | |
| 2015/0144957 A1* | 5/2015 | Lu | H01L 29/7787 257/76 |
| 2015/0206796 A1* | 7/2015 | Dasgupta | H01L 21/02381 257/76 |
| 2015/0263223 A1 | 9/2015 | Ito | |
| 2015/0318276 A1* | 11/2015 | Bayram | H01L 21/8258 257/195 |
| 2015/0340482 A1 | 11/2015 | Padmanabhan et al. | |
| 2016/0111496 A1 | 4/2016 | Leobandung | |
| 2016/0336437 A1* | 11/2016 | Kajitani | H01L 29/7786 |
| 2017/0221999 A1 | 8/2017 | Dasgupta | |
| 2017/0278959 A1 | 9/2017 | Then et al. | |
| 2018/0175184 A1 | 6/2018 | Then et al. | |

FOREIGN PATENT DOCUMENTS

| | | |
|---|---|---|
| JP | 2001230410 | 8/2001 |
| JP | 2002249400 | 9/2002 |
| JP | 2003069010 | 3/2003 |
| JP | 2007165431 | 6/2007 |
| JP | 2008004720 | 1/2008 |
| JP | 2008162888 | 7/2008 |
| JP | 2008305816 | 12/2008 |
| JP | 2009054807 | 3/2009 |
| JP | 2011049521 | 3/2011 |
| JP | 2011159795 | 8/2011 |
| JP | 2014078653 | 5/2014 |
| JP | 2014131028 | 7/2014 |

(56) References Cited

FOREIGN PATENT DOCUMENTS

| JP | 2014192167 | 7/2016 |
|---|---|---|
| KR | 20120048244 | 5/2012 |
| KR | 20130046249 | 5/2013 |
| KR | 101410092 | 6/2014 |
| WO | 2011064997 | 6/2011 |
| WO | 2015047355 | 4/2015 |
| WO | 2016209263 | 12/2016 |

OTHER PUBLICATIONS

International Preliminary Report on Patentability for International Patent Application No. PCT/US15/38096, dated Jan. 4, 2018.
EP Extended Search Report dated Apr. 18, 2019 for EP Patent Application No. 15892756.6.
Extended European Search Report from European Patent Application No. 15896569.9 notified Jan. 2, 2019, 14 pgs.
Guo, Jia et al., "MBE-Regrown Ohmics in InAlN HEMTs With a Regrowth Interface Resistance of 0.05Ω* mm", IEEE Electron Device Letters, vol. 33, No. 4, Apr. 2012, 3 pgs.
Hahn, H et al., "First monolithic integration of GaN-based enhancement mode n-channel and p-channel heterostructure field effect transistors", 72nd Device Research Conference, Jun. 2014 (Jun. 2014), pp. 59-260, XP055155997, DOI: 10.1109/DRC.2014.6872396 ISBN: 978-1-47-995405-6.
Katona, T.M. et al., "Control of crystallographic tilt in GaN grown on Si (111) by cantilever epitaxy", Applied Physics Letters, vol. 81, No. 19, Nov. 4, 2002, 3 pgs.
Masui, Hisashi et al., "Geometrical Characteristics and Surface Polarity of Inclined Crystallographic Plane of the Wurzite and Zincblende Structures", Journal of Electronic Materials, vol. 38, No. 6, 2009.
Takei, Y et al., "Ohmic Contact Properties Depending on AlGaN Layer Thickness for AlGaN/GaN High Electron Mobility Transistor Structures", ECS Transactions, vol. 61, No. 4, Mar. 20, 2014 (Mar. 20, 2014), pp. 265-270, XP055480356, US ISSN: 1938-6737, DOI: 10.1149/06104.0265ecst.
Wan, J. et al., "Growth of Crack-Free Hexagonal Gan Films on Si (100)", Applied Physics Letters, USA, Jul. 18, 2001, Vo. 79, No. 10. p. 1459-1460, DOI: 10.1063/1.1400770.

* cited by examiner

HETEROEPITAXIAL STRUCTURES WITH HIGH TEMPERATURE STABLE SUBSTRATE INTERFACE MATERIAL

CLAIM OF PRIORITY

This Application is a National Stage Entry of, and claims priority to, PCT Application No. PCT/US15/38096, filed on 26 Jun. 2015 and titled "HETEROEPITAXIAL STRUCTURES WITH HIGH TEMPERATURE STABLE SUBSTRATE INTERFACE MATERIAL", which is incorporated by reference in its entirety for all purposes.

BACKGROUND

Demand for integrated circuits (ICs) in portable electronic applications has motivated greater levels of semiconductor device integration. Many advanced semiconductor devices in development leverage non-silicon semiconductor materials, including compound semiconductor materials (e.g., GaAs, InP, InGaAs, InAs, and III-N materials). III-N materials, as well as other materials with wurtzite crystallinity, such as, but not limited to AgI, ZnO, CdS, CdSe, $\alpha$-SiC, and BN, show particular promise for high voltage and high frequency applications like power management ICs and RF power amplifiers. III-N heteroepitaxial (heterostructure) field effect transistors (HFET), such as high electron mobility transistors (HEMT) and metal oxide semiconductor (MOS) HEMT, employ a semiconductor heterostructure with one or more heterojunction, for example at an interface of a GaN semiconductor and another III-N semiconductor alloy, such as AlGaN or AlInN. GaN-based HFET devices benefit from a relatively wide bandgap (~3.4 eV), enabling higher breakdown voltages than Si-based MOSFETs, as well as high carrier mobility. The III-N material system is also useful for photonics (e.g., LEDs), photovoltaics, and sensors, one or more of which may be useful to integrate into an electronic device platform.

Multi-chip integration approaches have been employed to integrate silicon-based devices with devices using alternative semiconductor materials. These multi-chip approaches have scaling and performance limitations. Monolithic integration of silicon-based devices (e.g., CMOS field effect transistors) with devices utilizing non-silicon material systems is a challenge in part due to a large lattice mismatch (e.g., ~41% between GaN and Si) and a large thermal expansion coefficient mismatch (e.g., ~116% between Si and GaN). These mismatches can result in a great number of defects in the heteroepitaxial semiconductor thin films grown over silicon substrates. Without an ability to control propagation of defects, regions of sufficiently low defect density may not available to form highly functional semiconductor devices. One technique for monolithic integration relies on thick buffer layers, for example of 3-10 microns, or more. Such thick buffers however are expensive and complicate silicon CMOS integration. Structures and techniques to manage defect propagation in non-native semiconductor material systems epitaxially formed on CMOS-compatible substrates without thick buffers are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
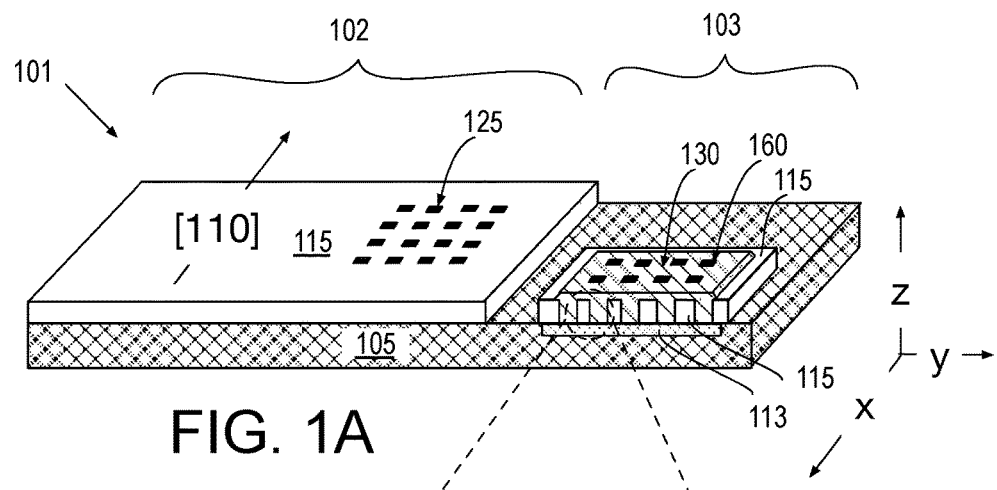
FIG. 1A is an isometric view of a System-on-Chip (SoC) including silicon-based MOSFETs on silicon and III-N HFETs on a heterostructure disposed over a silicon substrate, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are heteroepitaxial structures including one or more crystalline materials regrown from a template structure disposed over a substrate having a different composition than that of the regrown crystalline structure. In some embodiments, the substrate has a different crystallinity than that of the regrown crystalline material. In some exemplary embodiments, an elevated material of wurtzite crystallinity is grown within trenches of a trench material disposed over a substrate surface having different crystallinity, such as cubic or hexagonal.

As described below, elevated epitaxial crystalline structures and techniques offer a measure of control over defect propagation, particularly within wurtzite crystalline material heteroepitaxially formed on a cubic or hexagonal crystalline substrate surface. In some advantageous embodiments, and as further exemplified below, defects may be propagated away from a device layer as a means of reducing the defect density within active semiconductor device layers disposed over the heteroepitaxial structure.

In some embodiments, an interfacial material is disposed over the substrate surface. Functionally, the interfacial material may facilitate subsequent growth of a crystalline structure at growth temperatures that would otherwise degrade the substrate surface and thereby induce defects in the regrown crystal structure. The inventors have found certain substrate materials, such as crystalline silicon, having certain surface properties tuned to facilitate the subsequent growth of a non-silicon crystalline structure, may degrade through one or more mechanisms when exposed to epitaxial growth temperatures exceeding significantly beyond 700° C. More particularly, the inventors have found that crystalline silicon surfaces, such as (100) surfaces confined within narrow trenches of a template structure, may reflow during high temperature epitaxial regrowth processes. The inventors have further found substrate surface reflow to be significant for offcut silicon surfaces (e.g., 2-10° offcut from the (100) plane) when subsequent heteroepitaxial regrowth is performed from an exposed portion of the substrate surface that has a narrowest lateral dimension less than 500 nm. Deformation of these exemplary offcut crystalline silicon surfaces is exacerbated when regrowth is performed from an exposed portion of the substrate surface having even smaller critical dimensions (e.g., less than 50 nm). As such, an interfacial layer according to some embodiments described herein, may be employed to mitigate a disadvantageous interaction between high temperature non-native epitaxial regrowths and nanometer-scale templated substrates having highly engineered cubic growth surfaces.

FIG. 1A is an isometric view of a System-On-Chip (SoC) 101 including silicon-based MOSFETs 125 disposed over a first crystalline substrate surface region 102. SoC 101 further includes non-silicon-based HFETs 160 on an elevated non-silicon crystalline structure 130 disposed over an interfacial layer 113 that separates the elevated non-silicon crystalline structure 130 from a second crystalline substrate surface region 103, in accordance with an embodiment. Together, the elevated crystalline structure 130 and crystalline substrate surface region 103 form a semiconductor heterostructure. In some exemplary embodiments the elevated non-silicon crystalline structure 130 is a III-N material, such as, but not limited to AlN, GaN, AlGaN, InAlGaN. The inventors currently understand the structures and techniques described in detail in the context of a III-N material to be broadly applicable to a family of wurtzite semiconductors further including at least AgI, ZnO, CdS, CdSe, α-SiC, and BN, and may be further applicable to other non-silicon material systems, such as, but not limited to GaAs, InP, InAs, InGaAs, InGaP, etc. It is expected one of skill in the art familiar with the characteristics of these alternate semiconductor material systems will be able to successfully apply the techniques described herein absent some specific a priori knowledge of a salient incompatibility between the exemplary III-N material system described in detail herein and the alternate material system.

Continuing with FIG. 1A, elevated non-silicon crystalline structure 130 is disposed over a substrate surface of differing crystallinity, which in the exemplary embodiment is a surface region of substantially monocrystalline substrate 105 having a predetermined crystal orientation. Substrate 105 may be a variety of materials, including, but not limited to, silicon, germanium, SiGe, GaAs, InP, and 3C—SiC. In one exemplary embodiment substrate 105 is silicon, which is advantageous for monolithic integration of HFETs 160 with conventional silicon MOSFETs 125. Crystallographic orientation of a substantially monocrystalline substrate 105 may be any of (100), (111), or (110). Other crystallographic orientations are also possible. In one exemplary silicon substrate embodiment, substrate 105 is (100) silicon with crystalline substrate surface region 103 having cubic crystallinity. For a (100) silicon substrate 105, the semiconductor surface may advantageously miscut, or offcut, for example 2-10° toward [110], to facilitate nucleation of elevated crystalline structure 130. In another exemplary silicon substrate embodiment, substrate 105 is (111) silicon with crystalline substrate surface region 103 having hexagonal crystallinity.

Also disposed over the substrate crystalline surface is trench material 115. Trench material 115 can be of any amorphous material known, and in some advantageous embodiments is a dielectric composition known to provide sufficient electrical isolation between adjacent monolithically integrated semiconductor devices. In some exemplary embodiments, trench material 115 is an isolation dielectric, such as, but not limited to alumina ($Al_2O_3$), silicon oxides (SiO), silicon nitrides (SiN), silicon oxynitrides (SiON), silicon carbonitrides (SiCN), or polymer dielectrics (e.g., benzocyclobutene). In some embodiments, trench material 115 is an amorphous dielectric material patterned into stripes with regions of the substrate crystalline surface disposed between the stripes. In one exemplary embodiment where the substrate is (100) silicon, the trenches and stripes of dielectric material have their longest lengths aligned with the <110> direction of the substrate.

Figure 1B:
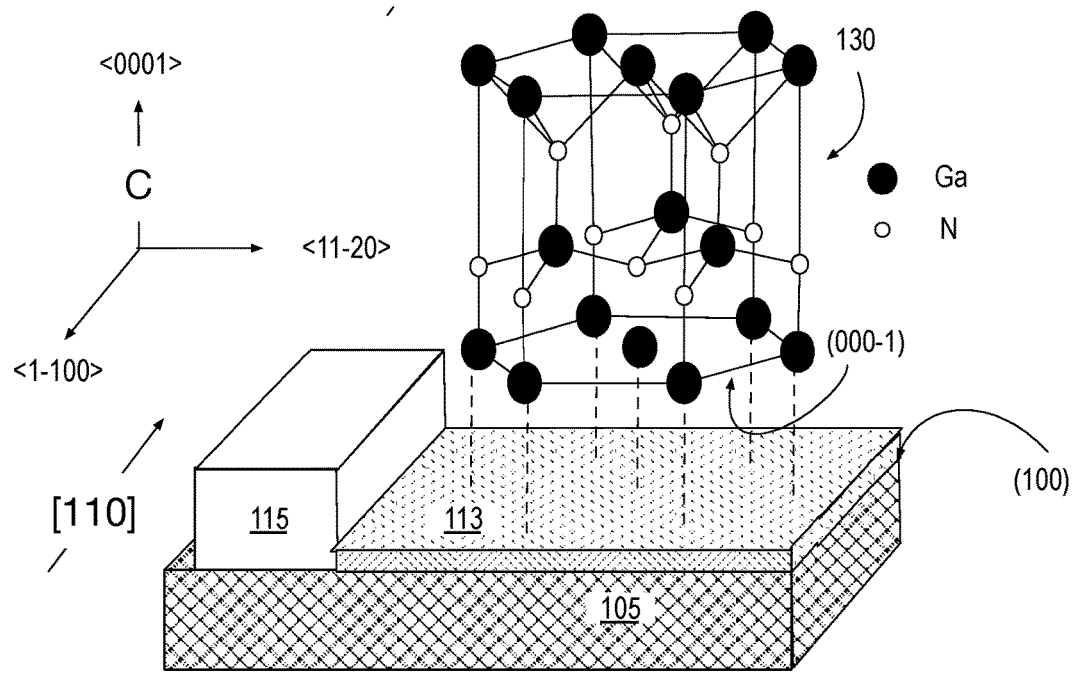
FIG. 1B is an expanded isometric view of a III-N heteroepitaxial crystal disposed on CMOS-compatible silicon substrate, in accordance with some embodiments.

FIG. 1B is an expanded isometric view of SoC 101 further illustrating an exemplary GaN heteroepitaxial crystalline structure 130 disposed over a CMOS-compatible silicon substrate 105, in accordance with an embodiment. Substrate 105 is CMOS-compatible both because of the (100) crystal orientation and because the patterned device features are biased to a <110> substrate direction. With the elevated crystalline structure 130 disposed within trench sidewalls that are aligned with the <110> direction, devices based on the III-N crystalline structure 130 (e.g., HFETs 160) may be formed with their current carrying direction aligned to that of MOSFETs 125. Such directional alignment between the monolithically integrated III-N devices and silicon devices may optimize performance of the MOSFETs 125 and simplify integration of the III-N devices into SoC 101. As further illustrated in FIG. 1B, the c-axis of elevated III-N crystalline structure 130 is ideally aligned approximately normal to a (100) substrate crystalline surface. Practically however, the c-axis may be slightly tilted, for example a few degrees less than normal to a (100) silicon substrate plane, as a result of imperfect epitaxial growth on an offcut substrate. In embodiments, the c-plane of III-N crystalline structure 130 no more than 10° from parallel to a (100) plane of the substrate. For (111) crystalline substrate surfaces the c-plane of III-N crystalline structure 130 is again ideally no more than 10° from parallel to a (111) plane of the substrate.

Wurtzite crystallinity lacks inversion symmetry, and more particularly the {0001} planes are not equivalent. For the exemplary GaN crystal illustrated in FIG. 1B, one of the {0001} planes is typically referred to as the Ga-face (+c polarity) and the other referred to as the N-face (−c polarity). In the exemplary embodiment, the {000-1} plane is more proximate the surface of substrate 105 and elevated crystalline structure 130 may be referred to as Ga polarity (+c) because the three bonds of Ga (or other group III element) point towards substrate 105. For alternate embodiments where the three bonds of Ga (or other group III element) point away from the substrate, elevated crystalline structure 130 would be referred to as N polarity (−c).

As further illustrated in FIG. 1B, interfacial material 113 is disposed over substrate 105, between the elevated crystalline structure 130 and the substrate 105. In some embodiments, interfacial material 113 is disposed directly on a (100) crystalline surface of substrate 105. Advantageously, interfacial material 113 is more stable at high temperatures than is substrate 105. For example, crystalline structure of interfacial material 113 ideally does not significantly deform or reflow at the regrowth temperature employed for crystalline structure 130, which may be considerably greater than 700° C. In advantageous embodiments, interfacial material 113 retains its surface lattice structure even at temperatures of 1000° C., or more. High temperature stability of interfacial material 113 ensures desirable microstructure properties of the substrate surface crystal are not lost during high temperature growths of crystalline structure 130. The interfacial material may therefore maintain desirable microstructure properties of the substrate surface crystal at the regrowth temperature so that the crystal quality of the growth is improved.

In further embodiments, interfacial material 113 has a lattice structure compatible with that of the crystalline structure 130, both in respect to lattice orientation and lattice length mismatch. In some embodiments, interfacial material 113 has a hexagonal lattice structure with the c-axis orientation extending normal to a (100) silicon substrate surface upon which the interfacial material is disposed. Hexagonal lattice structure is further compatible with III-N (wurtzite) crystallinity. In some other embodiments, interfacial material 113 has a hexagonal lattice structure with the c-axis orientation extending normal to a (111) silicon substrate surface upon which the interfacial material is disposed. In some alternate embodiments, interfacial material 113 disposed on a (100) silicon substrate surface has a cubic lattice structure. Cubic lattice structure is also compatible with III-N (wurtzite) crystallinity, particularly when the (100) surface is offcut by a few degrees, and can also ensure proper c-axis orientation.

In further embodiments, interfacial material 113 advantageously has a high band gap to provide good electrical insulating properties between substrate 105 and any device that is formed in or on crystalline structure 130 for minimal device leakage currents. For some exemplary embodiments, interfacial material 113 has a band gap over 3.4 eV, and may be 6.2 eV, or even higher.

In further embodiments, interfacial material 113 has a crystalline structure that can controllably direct defects (e.g. threading dislocations) in predetermined directions so as to filter out or reduce the density of such defects within regions of crystalline structure 130. For example, an interfacial material with cubic crystallinity epitaxially grown from certain cubic crystalline surfaces of a substrate are known to direct or propagate defects at specific angles. In some embodiments where interfacial material 113 has cubic crystallinity and is disposed upon a (100) surface of a silicon substrate 105, defects in the interfacial material, for example resulting from some lattice mismatch and/or thermal coefficient mismatch, will propagate at a 55° angle. In some embodiments where interfacial material 113 has hexagonal crystallinity, and is disposed upon a (100) surface of a silicon substrate 105, defects in the interfacial material will propagate along (1-100) and (0001) slip planes. Therefore, in accordance with some embodiments, interfacial material 113 may be employed in conjunction with other structural features to control defect densities within the elevated crystalline structure 130.

The substrate surface crystal should not deform during the formation of the interfacial material to the same extent that would occur during formation of the elevated crystalline structure 130. Hence, the interfacial material should either be of a composition that can be deposited at lower temperature than the elevated crystalline structure 130, or the stability of the substrate surface should be allowed to be greater during deposition of the interfacial material than it is during deposition of the elevated crystalline structure 130.

There are a number of non-silicon materials that offer one, or more, of the above advantageous interfacial material properties. Exemplary hexagonal interfacial material embodiments include one or more of AlN, GaN, AlGaN, TiAlN, HfN, BN, SiC, ScN, and ZnO. Exemplary cubic interfacial material embodiments include one or more of AlAs, AlAs on GaAs, GaP, and MgO. Each of these examples offer at least one of the above advantageous material properties, and some offer more than one of the above advantageous material properties. Notably, for embodiments where the elevated crystalline structure 130 is a III-N material, the interfacial material may also include a III-N material, and indeed may be of the same composition as one or more material of the elevated crystalline structure 130 (e.g., a GaN interfacial material with the GaN crystalline structure 130). For some such embodiments, forming the interfacial material prior to forming growth template masks of fine geometry improves substrate surface stability during interfacial material growth.

Figure 2A:
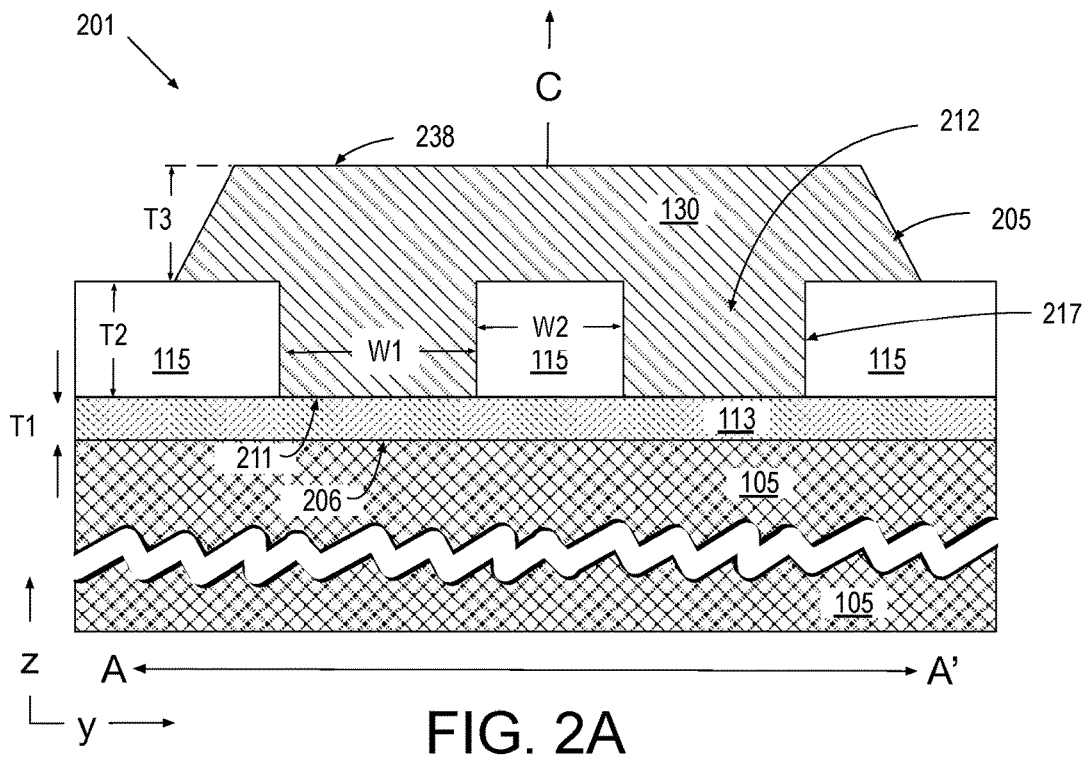
FIGS. 2A and 2B are cross-sectional views depicting a high temperature (HT) stable interfacial material between a III-N heteroepitaxial crystal and a non-III-N substrate, in accordance with some embodiments.
Figure 2B:
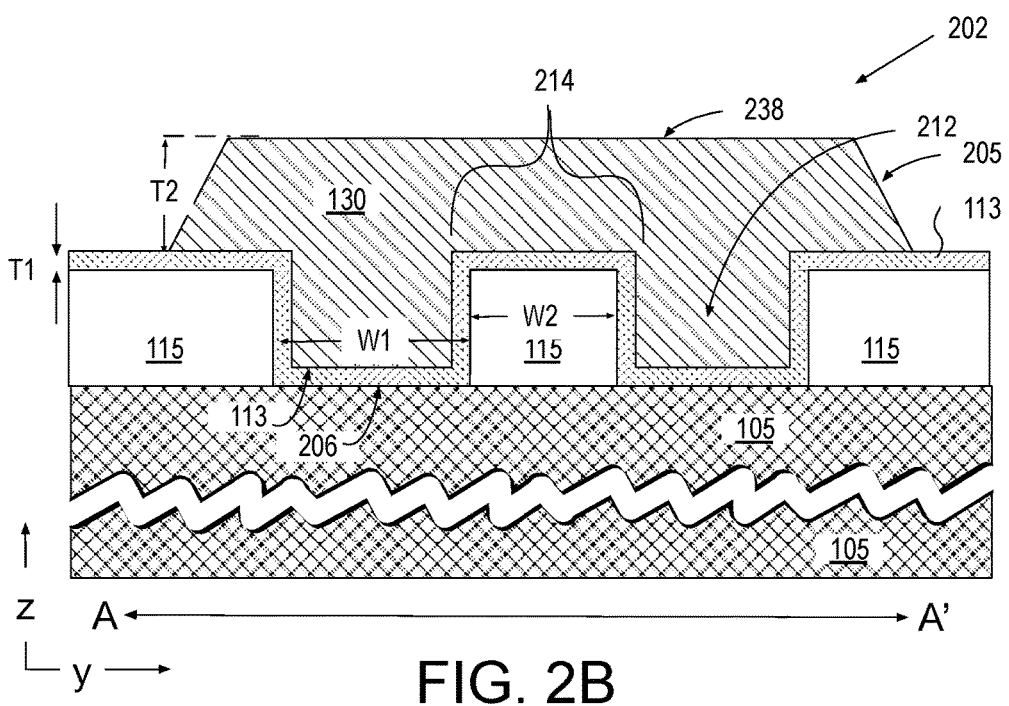

FIGS. 2A and 2B are cross-sectional views depicting a high temperature (HT) compatible interfacial material 113 between a III-N crystalline structure and a non-III-N crystalline substrate, in accordance with some embodiments. Each of the heterostructures 201 and 202 may be disposed, for example, over crystalline surface region 103 illustrated in FIG. 1A. FIG. 2A illustrates a first embodiment where the interfacial material 113 is an interlayer disposed between trench material and substrate. FIG. 2B illustrates a second embodiment where the interfacial material 113 is an interlayer disposed between trench material and III-N crystalline structure.

Referring first to FIG. 2A, an exemplary crystalline heterostructure 201 includes an elevated III-N crystalline structure 130 extending from one or more trenches formed through trench material 115. Each of the trenches exposes a crystalline interfacial material top surface 111 between adjacent stripes of trench material 115. As depicted, elevated crystalline structure 130 is disposed within a trench having a narrowest width or critical dimension (CD) W1. Trench width W1 may be advantageously minimized to reduce the z-height of raised crystalline structures to well below the thicknesses typically required for a traditional buffer layer. Furthermore, to reduce the regrowth time, trench material width W2 between adjacent trenches may be reduced. In some embodiments trench width W1 is less than 500 nm, advantageously less than 150 nm. In other embodiments, trench width W1 is less than 50 nm. While it has been found by the inventors that confinement of the epitaxial growth of III-N crystalline structure 130 by narrowly spaced trench material features (e.g., stripes) can advantageously trap and/or bend defects toward the structure sidewalls as the structure 130 grows laterally over and beyond trench material 115, the inventors have also found the substrate surface within these narrow trenches may be more prone to reflow and deformation mechanisms than is a larger open area, for example having an area on the micron scale. Hence, in some exemplary embodiments, interfacial material 113 is disposed between the trench material 115 and substrate 105, enabling the interfacial material 113 to be first formed over a substrate surface 206 that is free of finely patterned trench material 115. For such embodiments, a wide variety of interface materials may be employed, and indeed the interface material may even have the same composition as the crystalline structure 130 in reliance of greater temperature stability associated with the larger region of substrate surface 206. Subsequent templated growth of crystalline structure 130 may then proceed from the high temperature-stable surface 211 provided by interfacial material 113.

With interfacial material 113 in place over substrate surface 206, a high temperature stable surface 211 is exposed at the bottom of the trenches in trench material 115 (i.e., trench 212 lands on one or more material layers of interfacial material 113). III-N crystalline structure 130 extends from the interface material 113 at the trench bottom. Trench material 115 may have a wide range of thicknesses T2. In exemplary embodiments, T2 ranges from 10 nm to 200 nm when trench width W1 varies between 20 nm and 500 nm. Lateral width W2 of the trench material features may also vary significantly, for example from 100 nm to 1 μm. III-N crystalline structure 130 may be grown to an arbitrary height as a function of trench dimensions, growth conditions and growth duration. In some examples, thickness T3 over the trench material is between 500 nm and a few microns.

FIG. 2B illustrates an alternative embodiment where an exemplary crystalline heterostructure 202 includes an elevated III-N crystalline structure 130 extending from interfacial material 113 disposed within one or more trenches formed through trench material 115. Interfacial material 113 is disposed at a bottom of the trench between adjacent stripes of trench material 115, and is further disposed between trench material 115 and III-N crystalline structure 130 (as opposed to between trench material 115 and substrate 105). In this illustrative embodiment, interfacial material 113 is a liner of trench 212 disposed on the trench sidewalls. The heterostructure 202 illustrated in FIG. 2B is indicative of a technique where trench material 115 is deposited and patterned prior to the deposition of interfacial material 113. Such embodiments may advantageously utilize an interface material having a composition distinct from that of III-N crystalline structure 130, and which may be deposited at a lower temperature to avoid deformation of substrate 105.

In some embodiments, interfacial material 113 disposed on trench material 115 (e.g. interfacial material portion 214) has different microstructure than interfacial material 113 disposed at the bottom of trench 212. For example, interfacial material 113 may be more crystalline at the bottom of trench 212 than is interfacial material disposed on trench material 115. In some embodiments, interfacial material 113 has cubic or hexagonal crystallinity at the bottom of trench 212. In some further embodiments, an interfacial material 113 having cubic or hexagonal crystallinity at the bottom of trench 212 is substantially amorphous within interfacial material portion 214. Differences in interfacial material microstructure may result from the different microstructure between crystalline substrate surface 206 and amorphous surfaces of trench material 115. In further embodiments, interfacial material 113 is disposed only on a bottom of trench 212 (i.e., interfacial material portion 214 is absent). For example, interfacial material 113 may be selectively nucleated and formed at the bottom of trench 212, remaining substantially absent from the trench sidewalls. Such a structure is indicative of a deposition or growth process that is selective to crystalline substrate surface 206.

As with heterostructure 201, trench material 115 may again have a wide range of thicknesses T2 (e.g., 10 nm-200 nm), and trench width W1 may vary (e.g., 20 nm-500 nm). Lateral width W2 of the trench material features may also vary significantly, for example from 100 nm to 1 µm. III-N crystalline structure 130 may be grown to an arbitrary height as a function of trench dimensions, growth conditions and grow duration, substantially as described above for heterostructure 201.

As further illustrated in FIGS. 2A and 2B, elevated crystalline structure 130 extends to a top surface 238 having a z-height greater than that of trench material thickness T2. Portions of crystalline structure 130 within adjacent trenches 212 laterally merge into an arbitrarily large top surface 238. Elevated crystalline structure 130 includes a pair of sidewall facets 205 extending from a top surface of the elevated structure to an interface with the trench material 115 (FIG. 2A), or interfacial material 113 (FIG. 2B) disposed laterally beyond the trench sidewall 217. In depicted embodiments, the sidewall facets are inclined (non-parallel and non-normal to the c-axis). Sidewall facets 205 may intersect, forming a peaked elevated crystalline structure profile in the y-z plane. Depending on growth time, the only c-plane present may be at an apex along the centerline of an elevated structure 130. Inclined sidewall facets are advantageously semi-polar planes (e.g., {11-22} and {1-101}) that intersect the c-plane (0001) at between 50° and 80°. In some embodiments, sidewall facets 205 have a normal vector that is approximately 60° from the c-axis. For such embodiments, an elevated crystalline structure 130 may have a z-height above a top surface of trench material 115 that is at least $$\frac{\sqrt{3}}{2}$$

times a lateral trench width W1. The heterostructures 201 and 202 with sloped sidewall facets are indicative of a lateral epitaxial overgrowth (LEO) of the crystalline structure 130, which may for example advantageously bend and glide dislocations laterally away from the underlying trench 212 within which the III-N heterostructure interfaces with the interfacial material (seeding) surface 211. Alternatively, crystalline structure 130 may have vertical sidewalls with defects propagated vertically, for example to reduce the defect density within the laterally grown crystalline material disposed over trench material 115. For either LEO architecture however, interfacial material 113 may provide the benefit of maintaining desirable microstructure at surface 211.

In some embodiments, HT-stable interfacial material between an elevated crystalline structure and a substrate has a thickness between 10 nm and 2 µm. For the embodiment illustrated in FIG. 2B, interfacial material thickness T1 may be limited in part by the dimensions of trench 212. For example, interfacial material thickness T1 may be less than ½ the trench width W1. In some embodiments where the trench width W1 is less than 500 nm, interfacial material thickness T1 may be less than 100 nm. In some embodiments where the trench width W1 is less than 50, interfacial material thickness T1 may be between 10 nm and 20 nm. Depending on the compositions of interfacial material 113 and elevated crystalline structure 130 proximate to interfacial material 113, T1 may be more readily defined based on composition or microstructure. For example, where interfacial material 113 has a different composition than elevated crystalline structure 130, T1 may be readily measured between composition interfaces of substrate 105 and elevated crystalline structure 130. Where interfacial material 113 has a same composition as elevated crystalline structure 130, T1 may be more readily measured between a microstructural interface of elevated crystalline structure 130 (e.g. along a sidewall of trench 212 where interfacial material 113 may be amorphous) and a compositional interface with trench material 115.

Figure 3A:
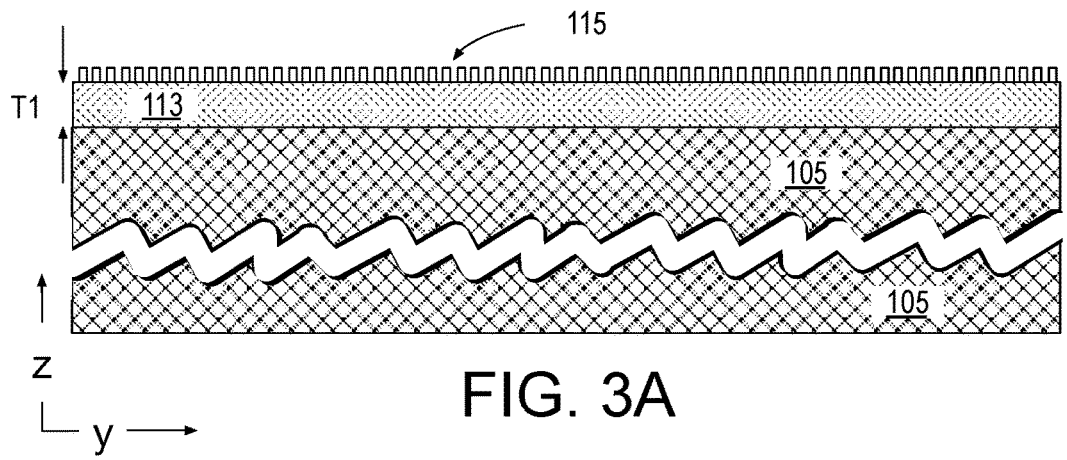
FIGS. 3A and 3B are cross-sectional views depicting a HT-stable interfacial material disposed over regions of a non-III-N substrate, in accordance with some embodiments.
Figure 3B:
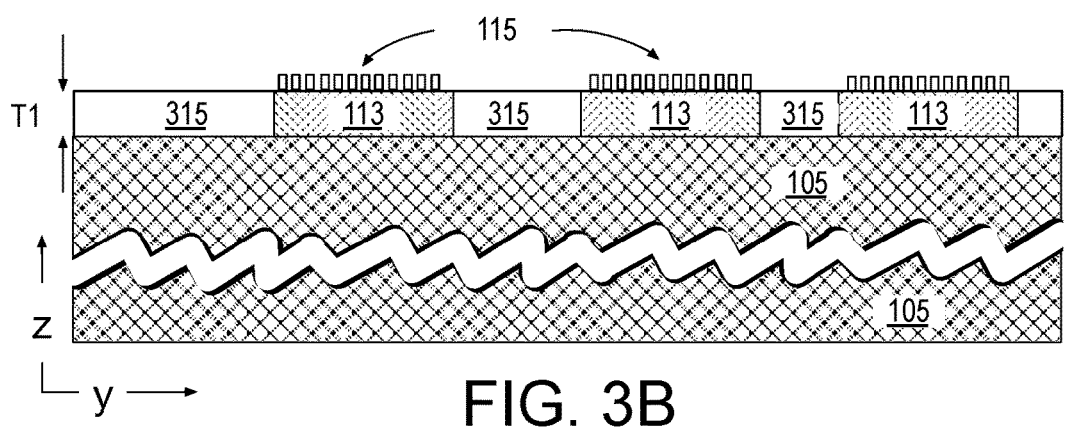

HT-stable interfacial material thickness may be limited in part by lattice mismatch and thermal coefficient mismatch with substrate 105. Stress induced by these mismatches is further impacted by dimensions of the substrate area occupied by the interfacial material. FIGS. 3A and 3B are cross-sectional views depicting an interfacial material 113 disposed over regions of a cubic substrate, in accordance with some embodiments. As illustrated in FIG. 3A, interfacial material 113 extends continuously over substantially the entire surface area of substrate 105. Such an embodiment may be utilized for example to fabricate maximum number of non-silicon based devices within elevated crystalline structures grown over the large expanse of interfacial material 113. For such embodiments, thermal coefficient mismatch between interfacial material 113 and substrate 105 (e.g., silicon) may readily lead to unacceptable degrees of substrate bowing. Interface material thickness T1 may therefore be limited to far less than 2 µm (e.g., 10 nm-1500 nm) to mitigate such issues.

Figure 3C:
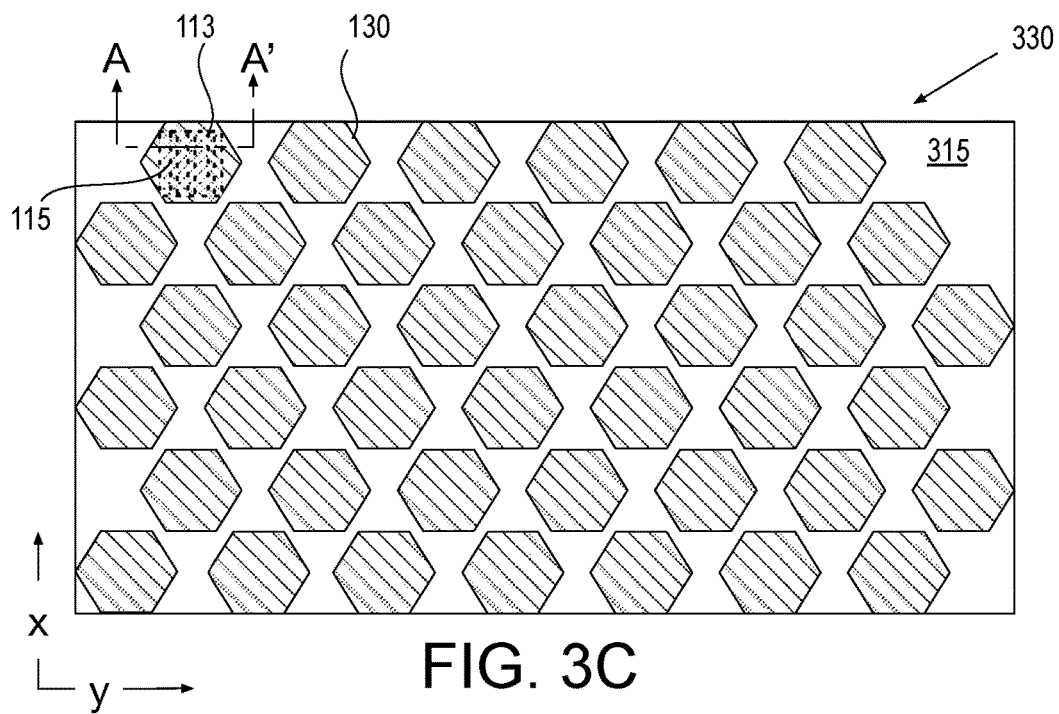
FIG. 3C is a plan view of III-N crystalline islands disposed over template structures and an HT-stable interfacial material present within regions of a non-III-N substrate, in accordance with some embodiments.

In some embodiments, interfacial material is confined within a second trench. For example, as illustrated in FIG. 3B, interfacial material 113 is discontinuous over the surface area of substrate 105 and confined to subregions by isolation material 315. Such an embodiment may be utilized, for example, to fabricate non-silicon based devices within elevated crystalline structures integrated with silicon-based devices fabricated within isolation regions 315. For such embodiments, thermal coefficient mismatch with substrate 105 (e.g., silicon) may be mitigated by isolation material 315, enabling a greater interfacial material thickness T1 (e.g., up to 2 µm). In some embodiments, substrate stress and resulting strain for a given interfacial material thickness, and given elevated crystalline structure thickness, is controlled through a patterned layout of the interfacial material. FIG. 3C is a plan view of III-N heteroepitaxial crystal islands 330 formed over template structures in a trench material 115. The sectional axis A-A' illustrated in FIGS. 2A and 2B is also referenced in FIG. 3C. Trench material 115 is illustrated in dashed line to represent trench material as an underlayer of an elevated III-N crystalline structure 130. Interfacial material 113, also illustrated in dashed line, is present within a perimeter defined by isolation material 315. Dimensions of spacing between adjacent islands of interfacial material 113, and/or control of relative substrate area occupied by interfacial material 113 and isolation material 315 may be employed to control substrate strain for a particular combination of interfacial material and III-N crystalline structure. The hexagonally shaped elevated III-N crystalline structure 130 illustrated in FIG. 3C is indicative of faceted LEO.

An HT-compatible interfacial material disposed between a substrate and elevated crystalline structure may have one or more material layer. In some embodiments, the interfacial material comprises a plurality of compositionally distinct material layers, or one or more compositionally graded layers. Substrate strain resulting from thermal mismatch may is tuned in some embodiments through control of material layer compositions and layer thicknesses within a composite interfacial material stack.

Figure 3D:
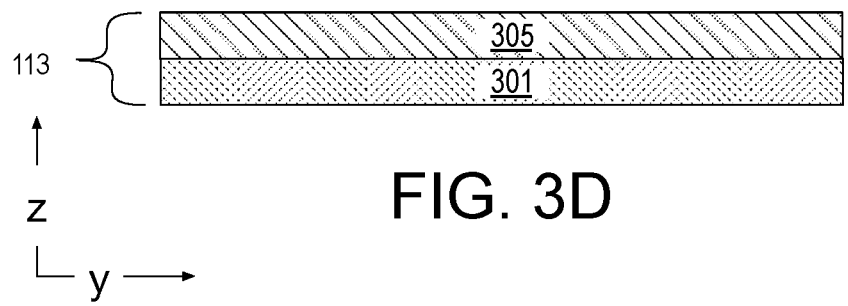
FIG. 3D-3E are cross-sectional views depicting multi-layered HT-stable interfacial materials, in accordance with some embodiments.
Figure 3E:
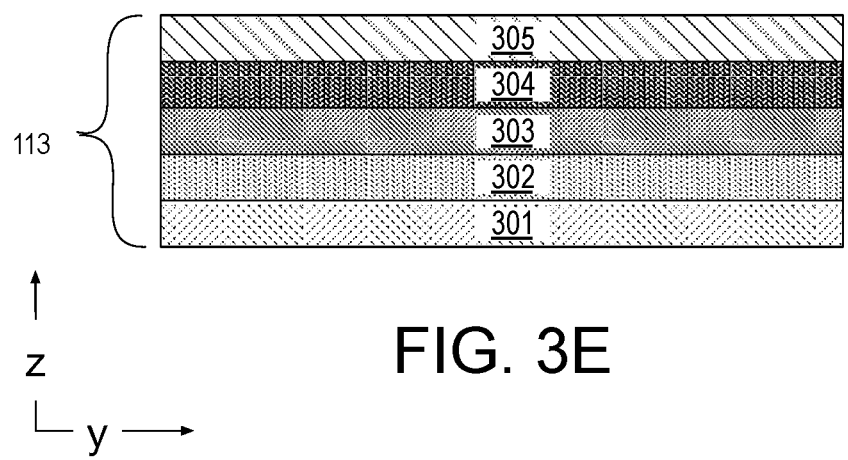

FIG. 3D-3E are cross-sectional views depicting multi-layered HT-stable interfacial material, in accordance with some embodiments. As shown in FIG. 3A, interfacial material 113 includes a base layer 301 having a first composition, and a capping layer 305 having a second composition, different than that of the first base layer 301. Each layer 301 and 305 may have any of the exemplary compositions described elsewhere herein for interfacial materials. Each material layer 301 and 305 may have a thickness of 10 nm-500 nm. In some embodiments, base layer 301 is merely a nucleation layer. In some embodiments, where interfacial material is a III-N material, base layer 301 is a first III-N material and capping layer 305 is a second III-N material. In one exemplary embodiment, base layer 301 is AlN and capping layer 305 is GaN. A capping layer of GaN may advantageously avoid any formation of oxide between a growth of the interfacial material and a subsequent growth of an elevated crystalline structure. For some embodiments where the elevated crystalline structure is GaN, the elevated crystalline structure and interfacial material capping layer 305 may be compositionally continuous with no additional nucleation layer disposed between capping layer 305 and the elevated crystalline structure. In some alternative embodiments where the elevated crystalline structure is GaN, a nucleation layer is further disposed between capping layer 305 and the elevated crystalline structure.

As shown in FIG. 3E, interfacial material 113 includes a base layer 301 having a first composition, capping layer 305 having a second composition, and a plurality of intervening layers (e.g., layers 302, 303, and 304) disposed there between. In some embodiments, the intervening layers perfect a compositional grading between the compositions of the base layer material and capping layer material. In one exemplary embodiment where base material layer 301 is AlN and capping material layer 305 is GaN, the intervening layers 302, 303, 304 decrement Al with a complementary increment in Ga. Thicknesses of each intervening layer may be selected to appropriately compensate thermal stress. For example, stress on a silicon substrate induced by formation of a raised GaN crystalline structure may be counteracted, at least in part, by a multi-layered interface material. In some embodiments, each intervening layer may be between 100 nm and 300 nm.

Figure 4A:
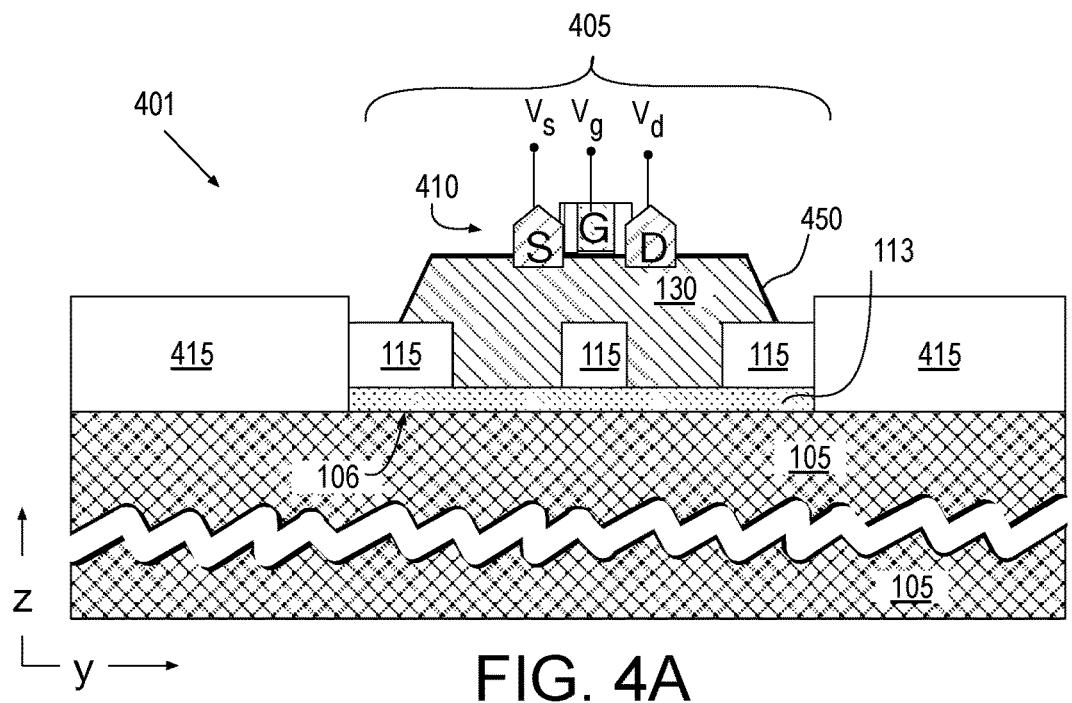
FIGS. 4A and 4B are cross-sectional views depicting planar III-N transistors formed in a III-N heteroepitaxial crystal with a HT-stable interfacial material disposed between the III-N crystal and substrate crystal, in accordance with some embodiments.
Figure 4B:
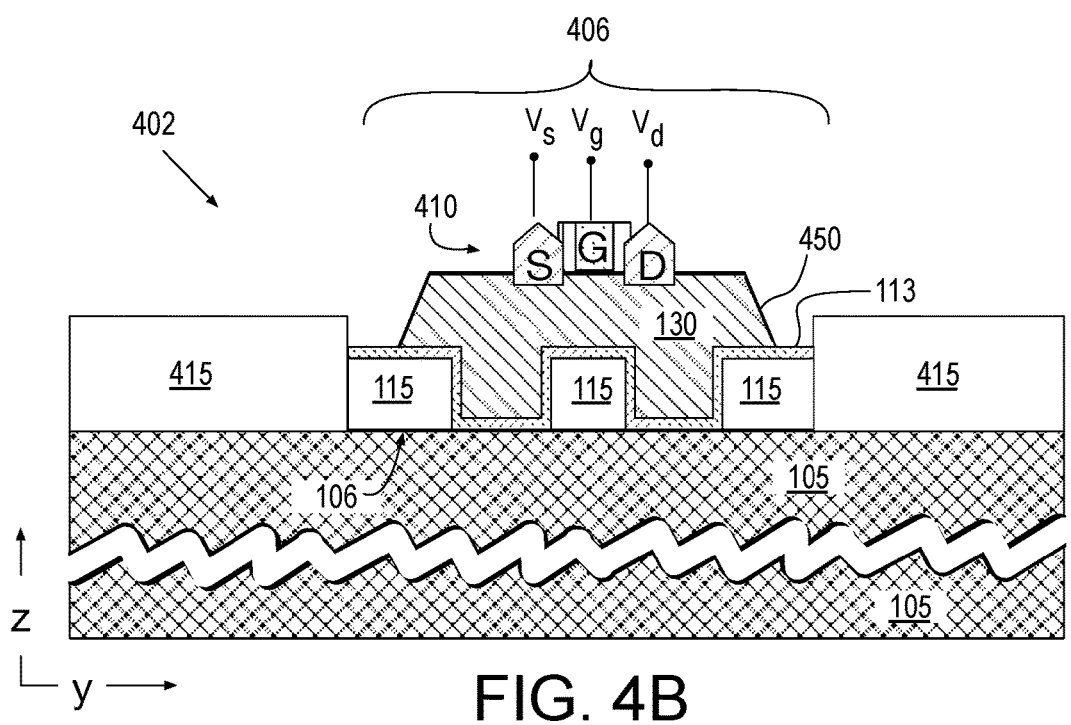

A planar surface of low defect density on an elevated crystalline structure may be utilized to form one or more semiconductor device, such as a high voltage transistor. FIGS. 4A and 4B are cross-sectional views of semiconductor devices 401 and 402, respectively. Each device includes a planar III-N transistor 410 formed in a III-N heteroepitaxial crystalline structure 130 over a HT-stable interfacial material 113 according to alternative embodiments. As shown in FIGS. 4A and 4B, a substrate portion 405 occupied by interfacial material 113 is defined by a trench pattern in isolation material 415. Isolation material 415 may be any amorphous material, such as, but not limited to, silicon-based dielectrics (e.g., $SiO_2$, SON, etc.). Trench material 115 is further disposed over interfacial material 113 and an elevated GaN crystalline structure 130 is disposed over trench material 115 substantially as described above in the context of FIGS. 2A and 2B. In further embodiments devices 401, 402 further include one or more silicon-based devices (not depicted), such as, but not limited to, a silicon-channeled MOS transistor, disposed adjacent to semiconductor device 401, 402.

In embodiments, a semiconductor heterostructure includes one or more semiconductor device layer disposed over at least one of an inclined sidewall facet or a c-plane surface of an elevated crystalline structure. For example, a device layer may be disposed over any of the exemplary heterostructures 201 or 202 (FIGS. 2A, 2B). A device layer may be one or more material layer, such as but not limited to crystalline non-silicon channel layers (e.g., GaN), crystalline non-silicon polarization layers (e.g., AlN, AlInN, AlGaN, InGaN), tunneling layers, quantum well structures, and the like. In exemplary III-N HFET embodiments depicted in FIGS. 4A and 4B, device layers include a polarization layer 410, such as, but not limited to AlGaN, deposited over a III-N channel (e.g., GaN) region of elevated crystalline structure 130. Polarization layer 450 is to create a two dimensional electron gas (2DEG) within a channel layer in elevated crystalline structure 130. Device 410 further includes one or more device terminal (e.g., Source, Drain, Gate depicted in FIGS. 4A and 4B) coupled to one or more semiconductor device layer disposed over at least one inclined sidewall facet or a c-plane surface of the GaN elevated crystalline structure 130.

Although exemplary III-N HFET embodiments are described in detail in the context of FIGS. 4A and 4B, the inventors currently understand the structures and techniques described herein to be broadly applicable to many other semiconductor devices including at least transistors (e.g., further including HBTs) and (photo)diodes for LED, photonic, or photovoltaic applications. Therefore, it is expected one of skill in the art familiar with the characteristics of an alternate semiconductor device will be able to successfully apply the techniques described herein absent some specific a priori knowledge of a salient incompatibility between the exemplary HFET device(s) and the alternate device(s).

Figure 5A:
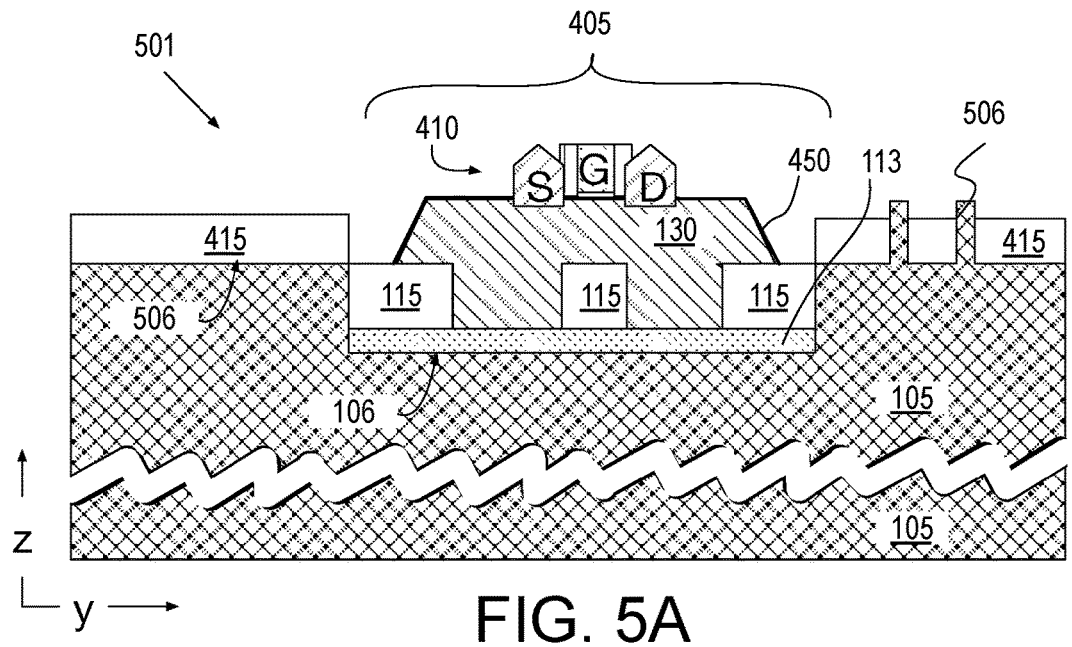
FIGS. 5A and 5B are cross-sectional views depicting a planar III-N transistor formed in a III-N heteroepitaxial crystal with a HT-stable interfacial material disposed within a recess of a substrate crystal, in accordance with some embodiments.
Figure 5B:
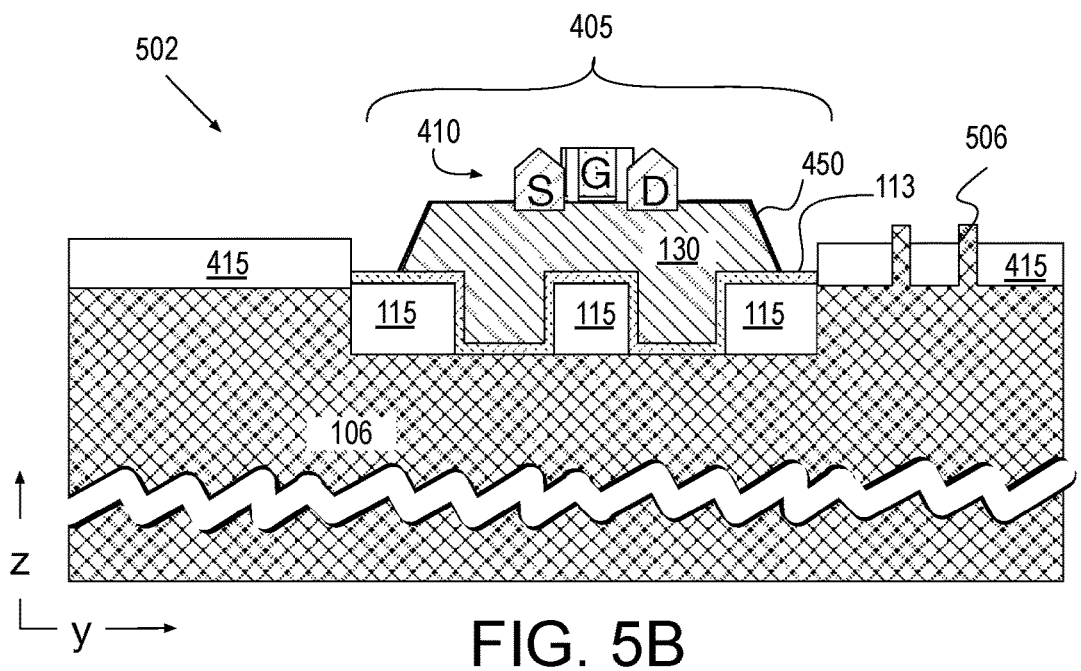

In further embodiments, interfacial materials are disposed within a trench that is recessed below a top surface of the substrate. Such substrate-embedded interfacial materials may reduce the z-height of an elevated crystalline structure relative to surrounding regions of the substrate, which may be advantageous for SoC embodiments including both non-silicon and silicon-based devices integrated on the one substrate. FIGS. 5A and 5B are cross-sectional views depicting monolithic devices 501 and 502, which include a planar III-N transistor 410 formed in an elevated III-N crystalline structure 130 with a HT-stable interfacial material 113 disposed within a recess of a crystalline substrate 105. As shown, substrate surface 206 is a recessed bottom of a trench in substrate 105. In exemplary embodiments, the substrate trench recess is significantly larger than a trench within trench layer 115. In some advantageous embodiments, the substrate trench recess occupies a substrate area of at least 1 µm$^2$, and may be 50 µm$^2$, or more. Interfacial material 113 is contained within the recessed substrate portion 406. Trench material 115 is also contained within recessed substrate portion 406, for example with a top surface of trench material 115 being substantially planar with a top surface of substrate 105 in non-recessed regions. Elevated III-N crystalline structure 130 is then disposed over interfacial material 113 and trench material 115. A z-height of III-N crystalline structure 130 in the illustrative embodiments is approximately equal to that of a non-planar silicon body (e.g., fin) 506 utilized for a silicon-based MOSFET. Like devices 401, 402 (FIG. 4A, FIB 4B), one or more device layer (e.g., polarization layer 450), and device terminals (e.g., Source and Drain terminals on opposite sides of a Gate terminal) are disposed over or on crystalline structure 130. In some III-N HFET embodiments, the gate terminal is disposed over a gate dielectric (not depicted). The gate terminal and gate dielectric comprise a gate stack over the III-N polarization layer and channel region of the elevated III-N crystalline structure. The gate terminal may be any metal or semiconductor known to have suitable conductivity and work function difference from a channel semiconductor layer disposed below the III-N polarization layer. The gate dielectric, if present, may be any high-k or conventional dielectric material known to be suitable for III-N FETs. Device terminals may be further coupled to silicon fin 506 following any known structural architecture.

Figure 6A:
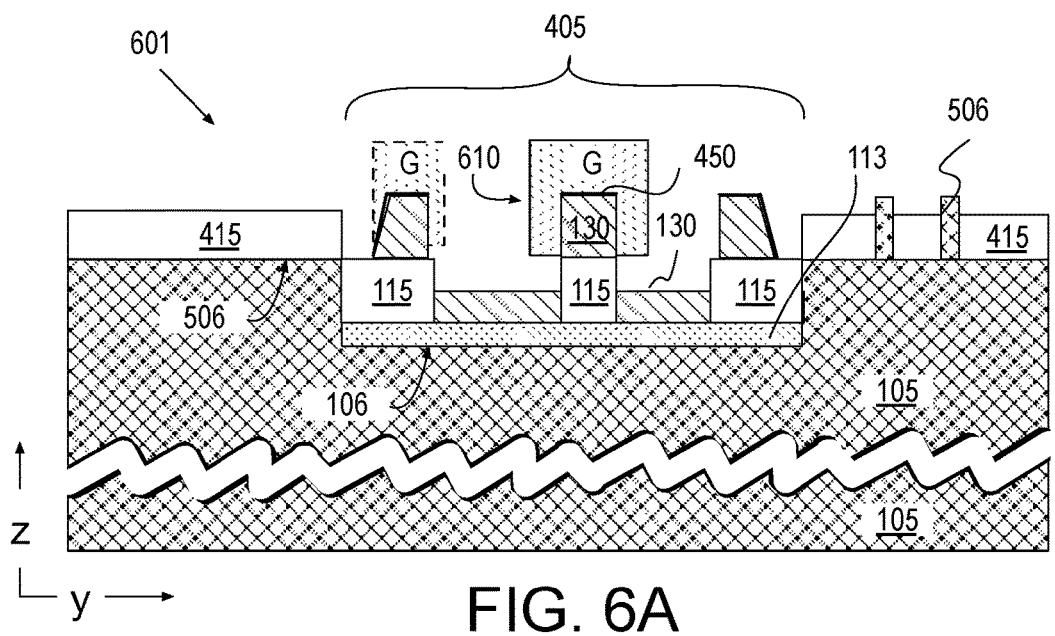
FIGS. 6A and 6B are cross-sectional views depicting a III-N transistor formed in a III-N heteroepitaxial crystal with a HT-stable interfacial material disposed between the III-N crystal and a substrate crystal, in accordance with some embodiments.
Figure 6B:
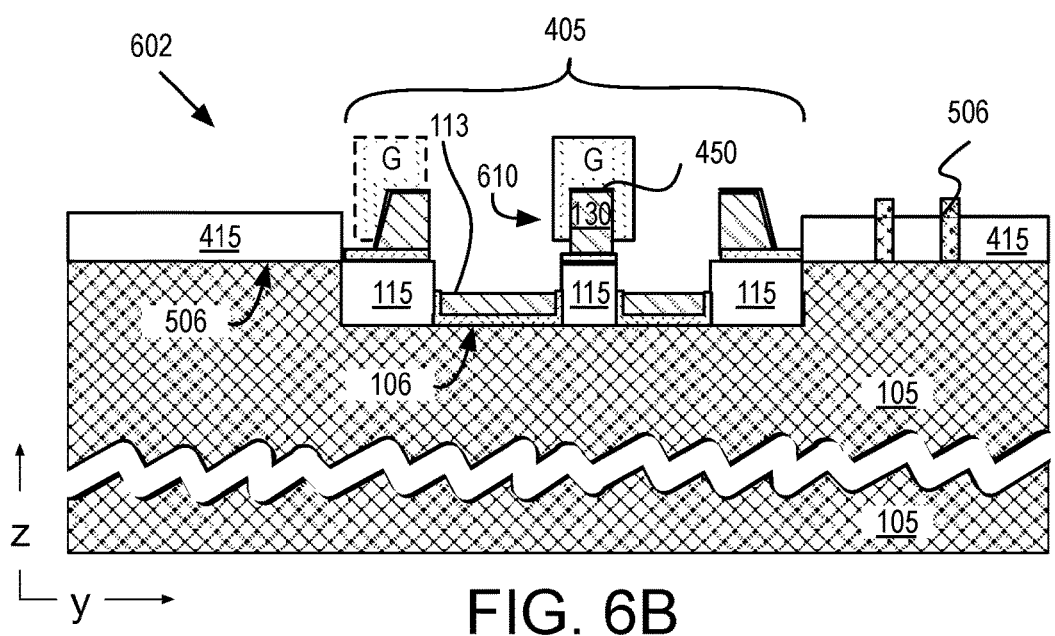

In some embodiments, a non-silicon device includes a fin extending from trench material. Crystalline material of the fin is disposed between an adjacent pair of two or more parallel trenches patterned in the trench material. FIGS. 6A and 6B are cross-sectional views depicting a device 601 and 602, respectively. Devices 601, 602 each include a III-N transistor 610 disposed in a III-N heteroepitaxial crystalline structure 130. A HT-stable interfacial material 113 is disposed between the III-N crystalline structure 130 and a silicon substrate 105. In comparison to the architectures depicted in FIGS. 5A and 5B, a portion of crystalline structure 130 in devices 601 and 602 has been removed to physically separate non-planar III-N bodies from crystalline or polycrystalline material disposed at the bottom of the one or more trench. Trench material 115 physically separates non-planar III-N bodies from the recessed portions of elevated III-N crystalline structure 130. In the embodiment illustrated in FIG. 6A, trench material 115 also physically separates non-planar III-N bodies from interfacial material 113 that is disposed on substrate 105, potentially improving electrical isolation of transistor 610. In the embodiment illustrated in FIG. 6B, trench material 115 physically separates non-planar III-N bodies and interfacial material 113 from substrate 105, potentially improving electrical isolation of transistor 610. Notably, transistor 610 is illustrated as a multi-gate device in FIGS. 6A and 6B with source/drain regions out of the plane of the figures. Even in the absence of a polarization layer on all facets of the non-planar III-N bodies, multi-sided gate coupling can advantageously improve channel confinement. In other embodiments, transistor 610 is a single-gate device. In further embodiments, additional HFETs may be fabricated, for example with second and third gate stacks (not depicted) disposed over the sloping, semi-polar planes shown in FIGS. 6A, 6B.

Figure 7:
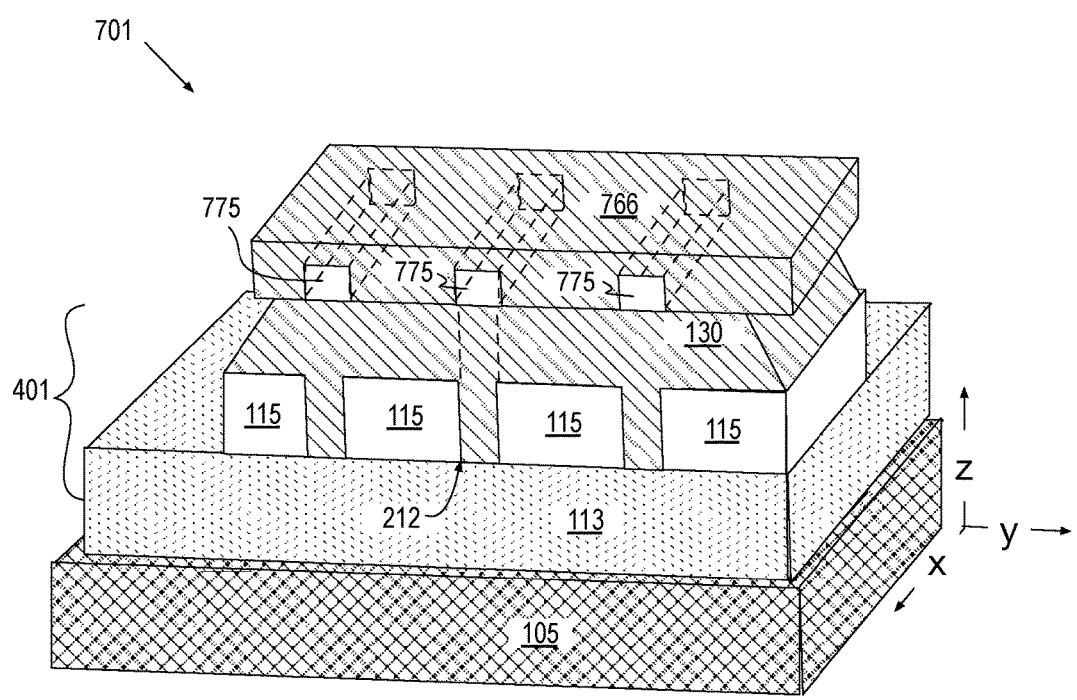
FIG. 7 is an isometric illustration III-N heteroepitaxial crystal islands disposed over multiple template structural layers and a HT-stable interfacial material, in accordance with some embodiments.

In further embodiments, raised III-N semiconductor structures having inclined sidewall facets are further augmented with a secondary III-N crystalline cap structure as illustrated in FIG. 7. Semiconductor heterostructure 701 includes a III-N crystalline cap 766 disposed over the semiconductor heterostructure 401 described above (e.g., including HT-stable interfacial material 113). In the exemplary embodiment, a III-N crystalline cap 766 is of the same material as elevated III-N crystalline structure 130 (e.g., GaN), however another III-N material may be utilized in the alternative. Embedded within III-N crystalline cap 766 is a plurality of trench material stripes 775 aligned in the z-dimension with trenches 416 as denoted by dashed lines in FIG. 7. Trench material stripes 775 may have lateral dimensions approximately equal to, or greater than those of trenches 212. Trench material stripes 775 may be of any of the materials described for trench material 115, such as, but not limited to silicon dioxide, silicon nitride, or similar dielectric material. As a result of a second LEO process, III-N crystalline cap 766 fills in trenches 212, extends over sidewalls of trenches 212, over trench material stripes 775, and overhangs inclined sidewall facets of structure 430.

The semiconductor heterostructures and semiconductor devices described above may be fabricated using a variety of methods. Interfacial material deposition and epitaxial overgrowth of the raised III-N semiconductor structures may utilize a variety of techniques and processing chamber configurations. In embodiments, lateral epitaxial overgrowth conditions are engineered to favor the inclined sidewall facets described above.

Figure 8A:
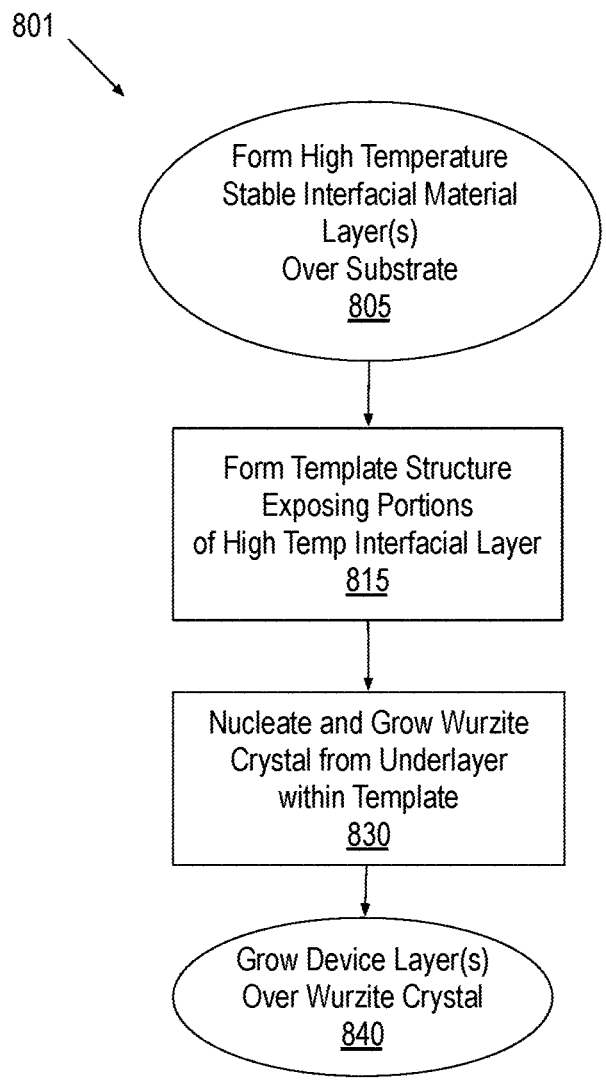
FIGS. 8A, 8B are a flow diagrams illustrating methods of forming a crystalline heterostructure over a HT-stable interfacial material, in accordance with embodiments.

FIG. 8A is a flow diagram illustrating a method 801 of forming a crystalline heterostructure, in accordance with embodiments. Method 801 may be utilized to form the semiconductor heterostructure 401 (FIG. 4A), for example. Method 801 begins with forming a high temperature-stable interfacial material layer over a crystalline substrate at operation 805. The interfacial material formed at operation 805 may have any of the properties described elsewhere herein. In some embodiments, a high temperature III-N epitaxial growth process is employed at operation 805. In one example an AlN material layer is grown from a silicon substrate surface at a temperature over 700° C., and advantageously 900° C., or more. In advantageous embodiments where the seeding surface of the silicon substrate is of reasonably large dimension, for example approximately 1 µm$^2$, the silicon substrate surface crystallinity is maintained during operation 805. Even for embodiments with an offcut silicon substrate surface, substrate surface reflow may be avoided at the elevated growth temperature employed to form the HT-stable interfacial material at operation 805.

Method 801 continues with formation of a template structure on the substrate semiconductor surface at operation 815. Any pattern transfer technique may be utilized at operation 815. While any template structure known to be suitable for heteroepitaxial growth of a non-silicon crystal may be employed at operation 815, for an exemplary (100) cubic semiconductor surface, the template comprises trenches extending in a <110> direction of the substrate. The template structures, for example, expose stripes of a (100) silicon surface.

At operation 830, the non-silicon material (e.g., III-N) is grown from the exposed HT-stable interface material surface to backfill the template structure (e.g., backfill the trench stripes). In some embodiments, elevated temperatures of 900° C., or more, are employed at operation 830 to epitaxially grow a GaN crystalline structure. In the presence of the HT-stable interface material formed at operation 805, material grown at operation 830 may be of improved crystal quality (i.e., lower defect density) than would be possible if the seeding surface reflowed during operation 830. Operation 830 may rely on first epitaxial growth conditions (e.g., a first III-N growth pressure, a first III-N growth temperature, and a first V/III growth precursor ratio), and may further include multiple growth conditions if a nucleation layer is first grown upon interfacial layer. When the template structure is substantially backfilled (i.e., a trench layer planarized), growth conditions may be changed to favor lateral growing the non-silicon crystalline structure (e.g., III-N) over the trench material. In some embodiments, the LEO process favors formation of inclined sidewall facets.

Method 801 completes at operation 840 with the formation of one or more semiconductor device layers over the elevated crystalline structure formed at operation 830. Operation 840 may entail, for example, epitaxial growth of a channel layer, and/or a polarization layer, and/or a quantum well stack, etc. Any epitaxial process known to be suitable for forming the desired device layer may be employed at operation 840. Device termination and interconnection may then proceed in any conventional manner to complete a semiconductor device (e.g., any of those described elsewhere herein in the context of FIG. 4A-6B).

Figure 8B:
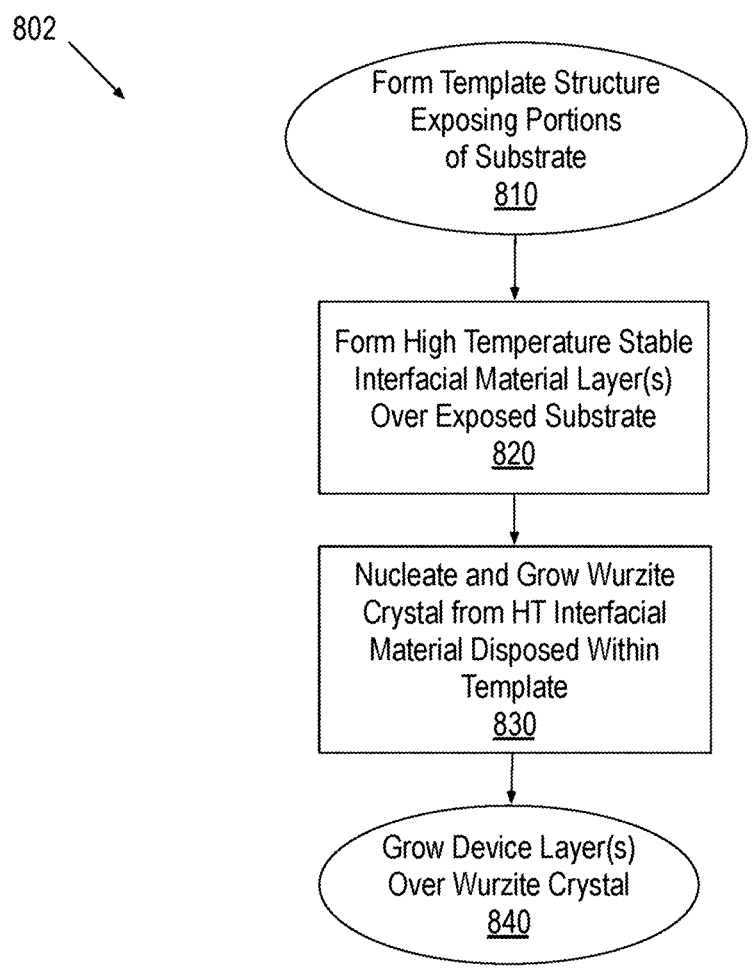

FIG. 8B is a flow diagram illustrating a method 802 of forming a crystalline heterostructure, in accordance with embodiments. Method 802 may be utilized to form the semiconductor heterostructure 402 (FIG. 4B), for example. Method 801 begins with forming a template structure exposing portions of an underlying substrate at operation 810. Any pattern transfer technique may be utilized at operation 810. In some embodiments, operation 810 entails forming trenches in a trench material and landing the trenches on a surface of the substrate having cubic crystallinity. Any template structure known to be suitable for heteroepitaxial growth of a non-silicon crystal may be employed at operation 810. In exemplary embodiments with a (100) cubic semiconductor surface, the template includes trenches extending in a <110> direction of the substrate. The template structures, for example, expose stripes of a (100) silicon surface.

Method 802 continues at operation 820 with formation of HT-stable interfacial material over the regions of crystalline substrate that were exposed by the trench patterning operation 810. The interfacial material formed at operation 820 may have any of the properties described elsewhere herein. In some embodiments, operation 820 entails a low temperature deposition process not exceeding 700° C. Exemplary low temperature deposition processes include atomic layer deposition (ALD), metal-organic chemical vapor deposition (MOCVD), and molecular beam epitaxy (MBE). In one example a HfN or TiAlN material layer is grown upon a silicon substrate surface at a temperature of no more than 700° C. Even in advantageous embodiments where the seeding surface of the silicon substrate within a trench is of nm dimension (e.g., a CD less than 150 nm), the silicon substrate surface crystallinity is maintained during operation 820. Even for embodiments with an offcut silicon substrate surface, substrate surface reflow may be avoided at operation 820 by employing a low temperature to form the HT-stable interfacial material.

At operation 830, the non-silicon material (e.g., III-N) material is grown from the exposed HT-stable interface material surface to backfill the template structure (e.g., backfill the trench stripes). In some embodiments, operation 830 entails epitaxially growing a GaN crystalline structure at elevated temperatures of 900° C., or more. In the presence of the HT-stable interface material formed at operation 820, material grown at operation 830 may be of improved crystal quality (i.e., lower defect density) than would be possible if the seeding surface reflowed during operation 830. Operation 830 may rely on first epitaxial growth conditions (e.g., a first III-N growth pressure, a first III-N growth temperature, and a first V/III growth precursor ratio), and may further include multiple growth conditions if a nucleation layer is first grown upon interfacial layer. When the template structure is substantially backfilled (i.e., a trench layer planarized), growth conditions may be changed to favor lateral growth of the non-silicon crystalline structure (e.g., III-N) over the trench material. In some embodiments, the LEO process favors formation of inclined sidewall facets.

Method 802 completes at operation 840 with the formation of one or more semiconductor device layers over the elevated crystalline structure formed at operation 830. Operation 840 may entail, for example, epitaxial growth of a channel layer, and/or a polarization layer, and/or a quantum well stack, etc. Any epitaxial process known to be suitable for forming the desired device layer may be employed at operation 840. Device termination and interconnection may then proceed in any conventional manner to complete a semiconductor device (e.g., any of those described elsewhere herein in the context of FIG. 4A-6B).

Figure 8C:
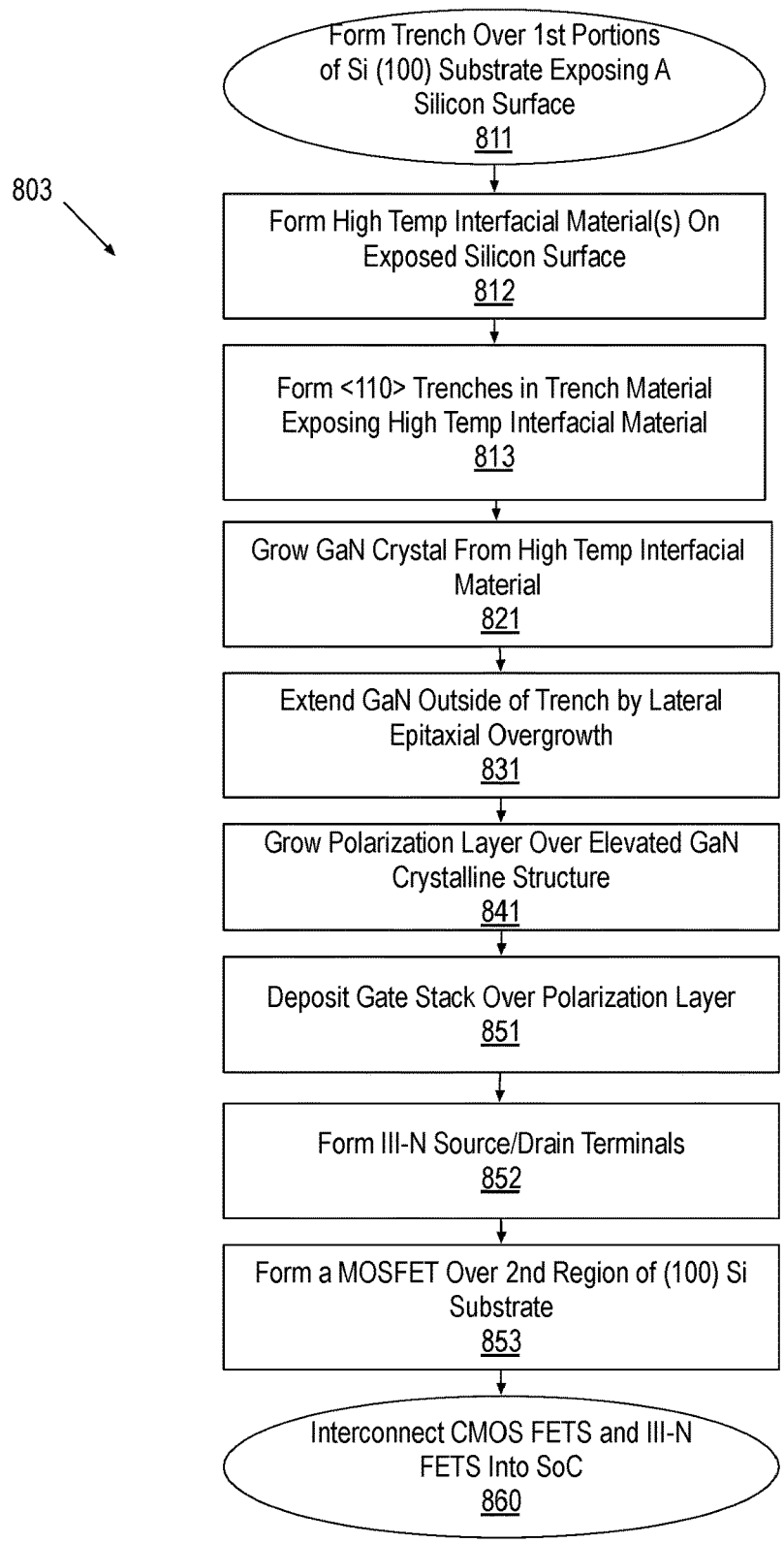
FIG. 8C is a flow diagram illustrating a method of forming a SoC including silicon-based MOSFETs and GaN-based HFETs, in accordance with embodiments.
Figure 9A:
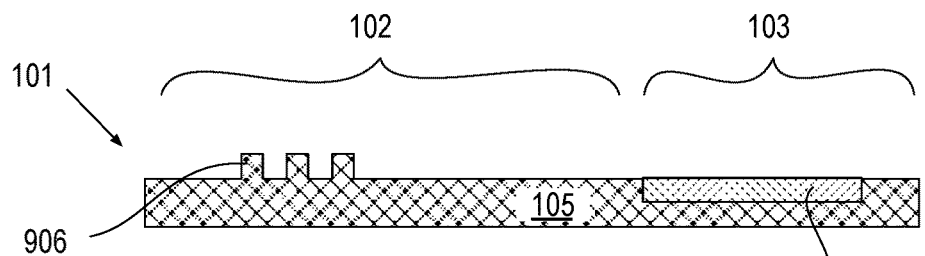
FIGS. 9A, 9B, 9C, 9D, 9E, 9F, 9G, and 9H are cross-sectional views of an SoC evolving as selected operations in the method illustrated in FIG. 8C are performed, in accordance with embodiments.
Figure 9B:
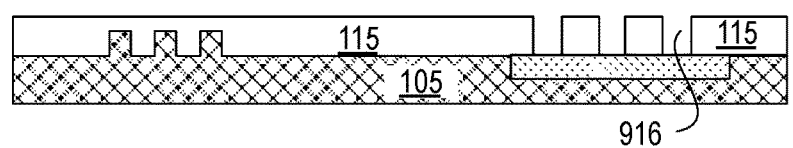
Figure 9C:
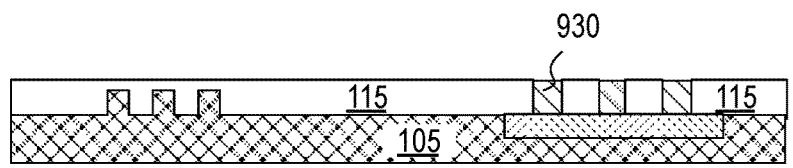
Figure 9D:
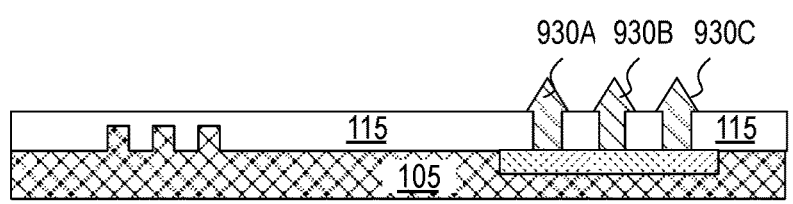
Figure 9E:
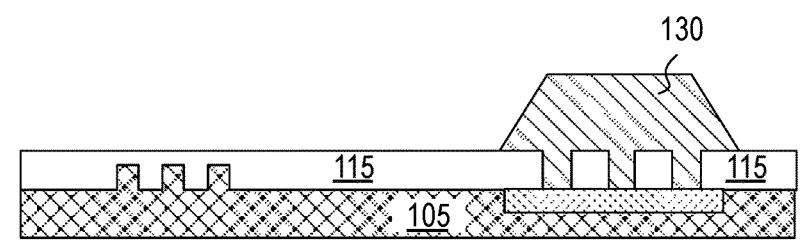
Figure 9F:
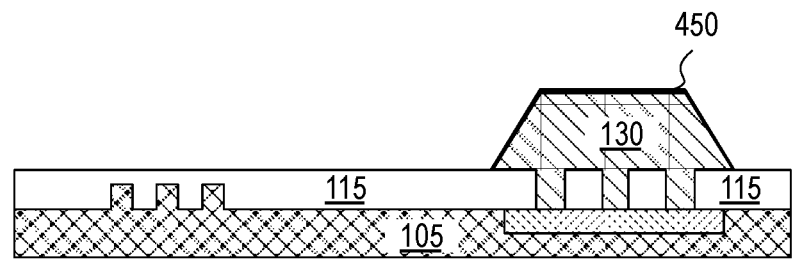
Figure 9G:
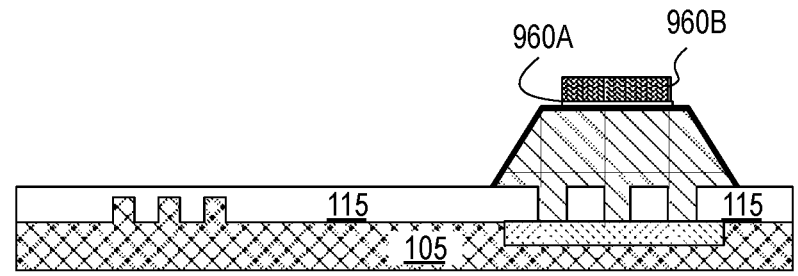
Figure 9H:
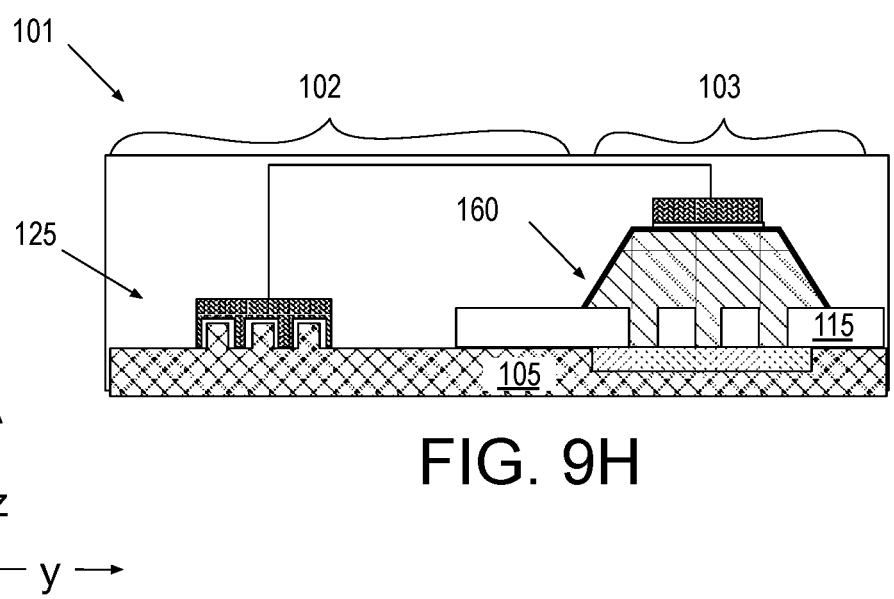

FIG. 8C is a flow diagram illustrating a method 803 of forming a SoC including silicon MOSFETs and GaN HFETs on a heteroepitaxial GaN structure disposed over an interfacial layer, in accordance with embodiments. Method 803 is one exemplary embodiment incorporating method 801 or 802. FIG. 9A-9H are cross-sectional views of an SoC evolving as selected operations in the method illustrated in FIG. 8C are performed, in accordance with some embodiments.

Referring to first FIG. 8C, method 803 begins with forming trenches in portions of a silicon substrate at operation 811. In some embodiments, deep trenches of more than a 1 μm depth, and at least 1 μm² in area, are patterned into a (100) silicon substrate. At operation 812, HT-stable interface material is formed on the exposed (100) silicon surface, for example with any epitaxial process known for the chosen material. In some embodiments, the HT-stable interface material completely backfills the substrate trench recess, but in some alternative embodiments, the HT-stable interface material is disposed at only a bottom of the substrate trench recess. In the exemplary embodiment further illustrated in FIG. 9A for SoC 101, HT-stable interface material 113 is planar with substrate 105 within region 103 while substrate region 102 has been patterned to form non-planar silicon fins 906.

Continuing with method 803 at operation 813, <110> oriented trench stripes are formed over a (100) silicon surface. In the exemplary embodiment further illustrated in FIG. 9B, trench material 115 is formed over fins 906 within first substrate surface region 102, and further patterned into trenches 916 within second substrate surface region 103.

Returning to FIG. 8C at operation 821, a nucleation layer is formed over the HT-stable material surface, and GaN is grown within the trenches using first epitaxial growth conditions. A thin nucleation layer (e.g., 10-50 nm thick) may be epitaxially deposited for example by chemical vapor deposition (CVD), vapor phase deposition (PVD/sputtering), or molecular beam epitaxy (MBE). This layer is advantageously selective to the exposed crystalline interfacial material surface and may not form on the trench material (e.g., dielectric/oxide). In some embodiments however, the nucleation layer is not selective and an amorphous material is formed on the non-crystalline trench material. In still other embodiments, no nucleation layer is grown over the interfacial material. GaN is grown at operation 821 until reaching the vertical height of the template sidewalls. Operation 821 may be terminated when the trenches are substantially filled. In the exemplary embodiment further illustrated in FIG. 9C, upon termination of operation 821, III-N semiconductor structure 930 is substantially planar with trench material 115.

Returning to FIG. 8 at operation 831, additional GaN crystal is formed outside of the template trench by a GaN LEO process, for example have conditions that favor inclined facets. For the exemplary embodiments, at least one of the first GaN growth pressure, the first GaN growth temperature, and the first N/Ga growth precursor ratio employed at operation 821 is changed to at least one of a second (higher) GaN growth pressure, a second (lower) GaN growth temperature, or a second (higher) N/Ga growth precursor ratio. In one exemplary embodiment, a first GaN growth pressure employed at operation 821 is increased at operation 831 to a second GaN growth pressure that is in the range of 30-350 Torr; a first GaN growth temperature employed at operation 821 is decreased at operation 831 to a second GaN growth temperature in the range of 950-1150° C.; and a first N/Ga growth precursor ratio employed at operation 821 is increased at operation 831 to a second N/Ga growth precursor ratio in the range of 100-5000 NH3/TMG. At operation 831, the GaN elevated crystalline structure 930 is advantageously grown over the trench material surface by no more than 1 μm. As further illustrated in FIGS. 9C and 9D, raised crystalline structures 930A, 930B, and 930C having peaked profiles are formed during an initial portion of operation 831. With additional LEO duration the peaks expand into trapezoidal profiles, which continue expand into a merged raised structure 130 illustrated in FIG. 9E.

Returning to FIG. 8C at operation 841, a device layer including a III-N polarization layer is grown over the raised GaN crystalline structure formed by the GaN LEO operation 831. Any conventional epitaxial process may be employed to form the III-N polarization layer. As further illustrated in FIG. 9F, a polarization layer 450 includes a III-N polarization layer that will form a 2DEG at the interface with the elevated crystalline structure 130. At operation 851 (FIG. 8C), a gate stack is deposited over the III-N polarization layer. In the exemplary embodiment further illustrated in FIG. 9G, formation of the gate stack further entails deposition of a gate dielectric 960A and deposition of a gate electrode 960B. Any known dielectric deposition process, such as CVD and ALD may be utilized to form gate dielectric 960A. Any known metal deposition process, such as CVD, ALD, and/or PVD may be utilized to form gate electrode 960B.

Method 803 (FIG. 8C) continues at operation 852 where III-N source/drain terminals are formed by epitaxially growing a source/drain semiconductor using any known technique. For example, a raised source/drain semiconductor may be grown subsequent to depositing a gate dielectric and gate electrode over a III-N polarization layer. Alternatively, source/drain semiconductor may be grown prior to depositing a gate dielectric and gate electrode over a III-N polarization layer. At operation 853, a silicon-based MOSFET is formed over the substrate. Any known MOSFET fabrication process may be enlisted at operation 853. In the exemplary embodiment further illustrated in FIG. 9H, a non-planar MOSFET 125 (e.g., finFET) is formed using any known technique. In alternate embodiments, a planar MOSFET may be formed. Method 803 (FIG. 8C) ends at operation 860 with interconnection of silicon-based MOSFET with III-N-based HFET using any known backend metallization process.

Figure 10:
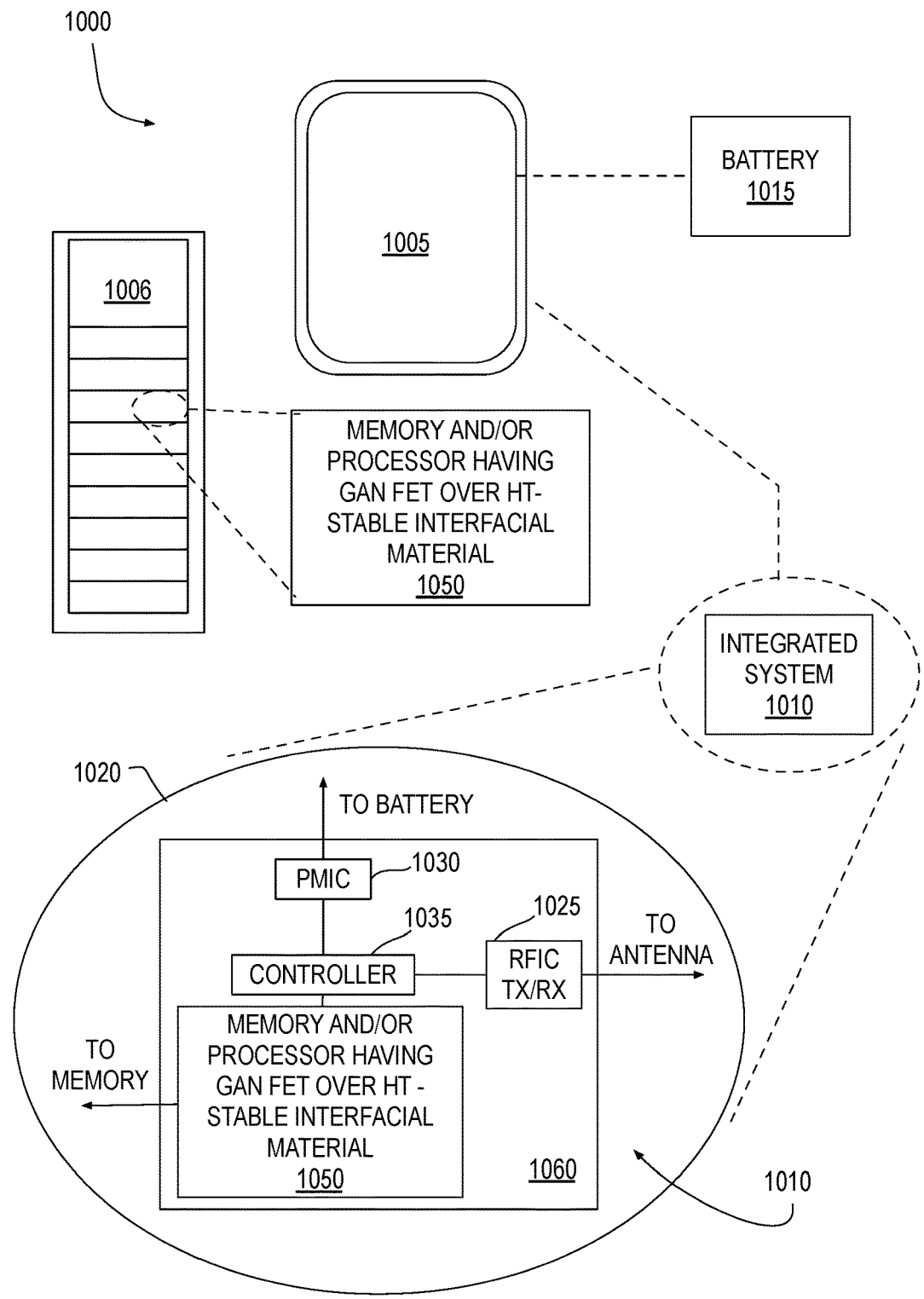
FIG. 10 illustrates a mobile computing platform and a data server machine employing an SoC including silicon FETs on silicon and GaN HFETs on a heteroepitaxial GaN structure disposed over a HT-stable interfacial material, in accordance with embodiments of the present invention.

FIG. 10 illustrates a system 1000 in which a mobile computing platform 1005 and/or a data server machine 1006 employs an IC including at least one GaN HFET disposed over a HT-stable interfacial layer, in accordance with embodiments of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) including at least one III-N HFET disposed over a HT-stable interfacial layer, for example as describe elsewhere herein. The monolithic IC 1050 may be further coupled to a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 11:
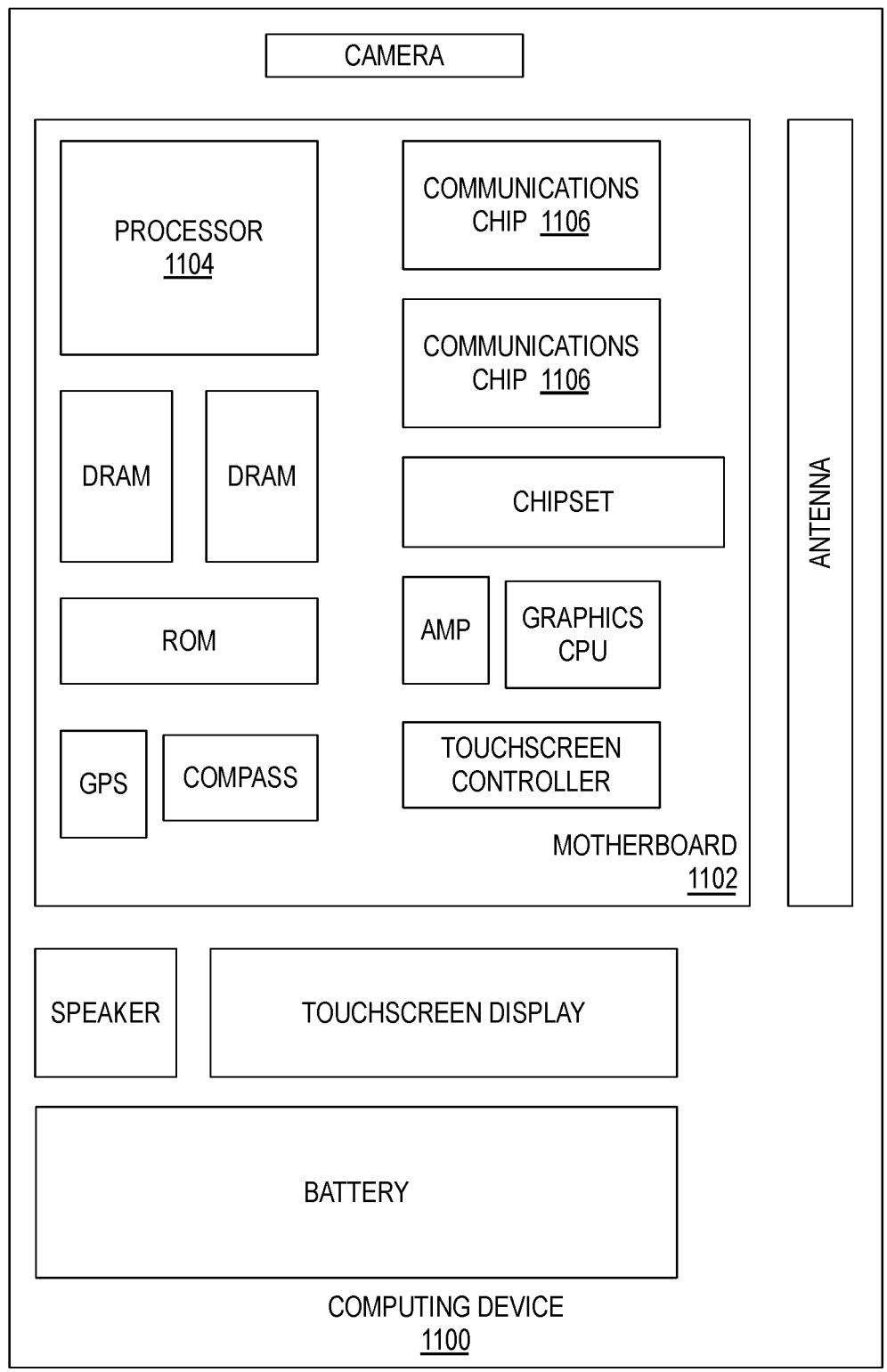
FIG. 11 is a functional block diagram of an electronic computing device, in accordance with an embodiment of the present invention.

FIG. 11 is a functional block diagram of a computing device 1130, arranged in accordance with at least some implementations of the present disclosure. Computing device 1130 may be found inside platform 1005 or server machine 1006, for example. Device 1130 further includes a motherboard 1132 hosting a number of components, such as, but not limited to, a processor 1134 (e.g., an applications processor), which may further incorporate at least one III-N HFET disposed over an HT-stable interfacial layer, in accordance with embodiments of the present invention. Processor 1134 may be physically and/or electrically coupled to motherboard 1132. In some examples, processor 1134 includes an integrated circuit die packaged within the processor 1134. In general, the term "processor" or "microprocessor" may refer to any device or portion of a device that processes electronic data from registers and/or memory to transform that electronic data into other electronic data that may be further stored in registers and/or memory.

In various examples, one or more communication chips 1136 may also be physically and/or electrically coupled to the motherboard 1132. In further implementations, communication chips 1136 may be part of processor 1134. Depending on its applications, computing device 1130 may include other components that may or may not be physically and electrically coupled to motherboard 1132. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1136 may enable wireless communications for the transfer of data to and from the computing device 1130. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1136 may implement any of a number of wireless standards or protocols, including but not limited to those described elsewhere herein. As discussed, computing device 1130 may include a plurality of communication chips 1136. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a crystalline heterostructure, comprises a substrate having a first crystallinity, a trench material disposed over the substrate, and an elevated structure having a second crystallinity disposed in one or more trench in the trench material. An interfacial material is disposed a bottom of the trench between the elevated structure and the substrate, wherein the interfacial material comprises at least one of an interlayer disposed between the trench material and the substrate, an interlayer disposed between the elevated structure and the trench material.

In furtherance of the first embodiments, the trench material comprises one or more amorphous material. The substrate surface comprises (111) silicon or (100) silicon miscut by less than 10°. The elevated structure comprises a III-N material with the c-plane no more than 10° from parallel to the (111) or (100) plane of the substrate. The trench has a minimum lateral dimension of less than 150 nm, and a depth of the trench is at least 10 nm.

In furtherance of the embodiment immediately above, the trench has a minimum lateral dimension of between 10 nm and 50 nm.

In furtherance of the first embodiments, the interfacial material comprises one or more material layer disposed between the trench material and the substrate, and the trench lands on at least one of the one or more of the material layers disposed between the trench material and the substrate.

In furtherance of the embodiment immediately above, the interfacial material comprises at least one layer having hexagonal or cubic crystalline microstructure, and has a total thickness from an interface of the substrate to an interface of the trench material that is between 10 nm and 2 μm.

In furtherance of the embodiment immediately above, the interfacial material comprises at least one layer of AlN, GaN, and AlGaN.

In furtherance of the embodiment immediately above, the interfacial material comprises a plurality of compositionally distinct material layers or one or more compositionally graded layers.

In furtherance of the embodiment immediately above, the interfacial material comprises at least one layer of AlAs on GaAs, AlAs, GaP, MgO.

In furtherance of the first embodiments, the III-N material comprises at least one material layer of GaN, the interfacial material comprises one or more material disposed between the trench material and the GaN material layer, and the at least one of the one or more of the material layers comprise a liner of the trench.

In furtherance of the embodiment immediately above, at least a portion of the interfacial material disposed within the trench has hexagonal microstructure, and at least a portion of the interfacial material disposed over the trench material has amorphous microstructure.

In furtherance of the embodiment immediately above, the interfacial material comprises at least one layer of AlN, HfN, TiAlN, SiC, ScN, or ZnO, and has a total thickness from an interface of the substrate to an interface of the GaN material layer that is less than 50 nm.

In furtherance of the first embodiments, the interfacial material is confined within a second trench, the second trench comprising a recess of at least 1 μm² in the substrate, the interfacial material and a bottom of the one or more trenches is recessed below a top surface of the substrate semiconductor, the elevated structure has a pair of inclined sidewall facets that are semi-polar planes intersecting the c-plane at angles of 50-80 degrees, and the elevated structure has a z-height above a top surface of the trench material that is at least $$\frac{\sqrt{3}}{2}$$

times a lateral width of the trench.

In one or more second embodiments, a semiconductor device comprises a crystalline silicon substrate, a trench material disposed over the substrate, an elevated crystalline non-silicon structure having disposed in one or more first trench in the trench material, and an interfacial material disposed a bottom of the trench between the elevated structure and the substrate. The interfacial material comprises at least one of a material layer disposed between the trench material and the substrate, or a material layer disposed between the elevated structure and the trench material. The device further comprises one or more crystalline device layer disposed over a surface of the elevated structure, and one or more device terminal coupled to the one or more device layer.

In furtherance of the second embodiments, the elevated structure comprises a III-N crystalline material disposed over the trench material. The device layer comprises a III-N polarization layer having a different composition than the III-N crystalline material disposed between the III-N polarization layer and the trench material. A gate stack comprising a first of the one or more device terminals is disposed over the III-N polarization layer and a channel region of the elevated structure. A source terminal and a drain terminal are disposed on opposite sides of the gate stack.

In furtherance of the embodiment immediately above, the III-N polarization layer and the III-N crystalline material disposed between the gate stack and the trench material comprise a fin extending from the trench material. The III-N crystalline material of the fin is separated, by one or more amorphous dielectric material, from crystalline or polycrystalline material disposed within the one or more trench.

In furtherance of the embodiment immediately above, the substrate surface comprises (100) silicon offcut by less than 10°, the elevated structure comprises a III-N material island with the c-plane no more than 10° from parallel to the (111) or (100) plane of the substrate, the one or more first trench comprises two or more parallel first trenches extending in a <113> direction of the substrate surface, the interfacial layer is confined within a second trench, the second trench comprising a recess in the substrate, the interfacial layer and bottoms of the two or more parallel first trenches are recessed below a top surface of the substrate, and the III-N crystalline material of the fin is disposed between an adjacent pair of the two or more parallel first trenches.

In furtherance of the second embodiments, the device of further comprises a silicon-channeled MOSFET disposed over a region of the substrate surface adjacent to the elevated structure.

In one or more third embodiments, a method of forming a crystalline heterostructure comprises forming one or more trench in a trench material layer disposed over a substrate having a first crystallinity. The method comprises forming an interfacial material at the bottom of the one or more trench, either by landing the trench on the interfacial material or by depositing the interfacial material within the one or more trench. The method comprises epitaxially growing an elevated crystalline structure of a second crystallinity over the interfacial material disposed within the one or more trench, and growing one or more device layer over the elevated structure.

In furtherance of the embodiment immediately above, the substrate surface comprises (111) silicon or (100) silicon offcut by less than 10°, forming the trench in the trench material layer further comprises etching into a dielectric layer a pair of trenches exposing the substrate surface, and forming the interfacial material further comprises depositing a liner within the trench and over the exposed substrate surface with a low temperature deposition process not exceeding 700° C.

In furtherance of the third embodiments, the substrate surface comprises (111) silicon or (100) silicon offcut by less than 10°, forming the interfacial material further comprises epitaxially growing the interfacial material from the substrate surface with a high temperature process exceeding 700° C., and forming the trench in the trench material layer further comprises etching into a dielectric layer a pair of trenches exposing the interfacial material.

In furtherance of the embodiment immediately above, forming the interfacial material further comprises epitaxially growing at least one of a compositionally graded III-N crystalline material, or a plurality of compositionally varied III-N crystalline materials.

In furtherance of the third embodiments, the method further comprises etching a second trench within the substrate, and depositing the trench material and the interfacial material within the second trench.

In furtherance of the third embodiments, epitaxially growing the elevated structure further comprises laterally growing at least a portion of the structure over the trench material at a rate that favors wurtzite crystal facets non-parallel and non-normal to the c-plane. The method further comprises depositing a device terminal over the top surface of the raised semiconductor structure parallel to the c-plane.

In furtherance of the third embodiments, epitaxially growing the elevated structure within the trench further comprises epitaxially growing a GaN material, growing the one or more device layer further comprises growing a III-N polarization layer over the GaN material, and selectively recessing the GaN material to form fins extending from trench material disposed between an adjacent pair of the one or more trenches.

In furtherance of the embodiment immediately above, the method further comprises depositing a gate stack over the polarization layer, and forming a source terminal and a drain terminal on opposite sides of the gate stack.

In furtherance of the embodiment immediately above, the method further comprises forming a MOSFET over a (100) silicon surface in a second region of the substrate adjacent to the crystalline heterostructure, wherein forming the MOSFET further includes forming a second gate stack over the (100) silicon surface adjacent to the elevated semiconductor structure, and forming a second source terminal and second drain terminal aligned with the second gate stack along the <110> direction.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. A crystalline heterostructure, comprising:
a substrate comprising silicon, and having a first crystallinity;
an isolation material over a first region of the substrate;
a trench material over at least a second region of the substrate, the second region of the substrate adjacent to the first region of the substrate;

an elevated structure comprising a III-N material having a second crystallinity, the elevated structure in one or more trenches in the trench material, the one or more trenches over the second region of the substrate; and
an interfacial material within the trench between the elevated structure and the second region of the substrate, wherein the interfacial material is adjacent to the isolation material, and the interfacial material comprises at least one of:
an interlayer between the trench material and the substrate; or
an interlayer between the elevated structure and the trench material.

2. The heterostructure of claim 1, wherein:
the trench material comprises an amorphous material;
the substrate has a surface within the second region that comprises (111) silicon, or (100) silicon;
the III-N material has a c-plane no more than 10° from parallel to the (111) or (100) plane of the substrate.

3. The heterostructure of claim 2, wherein the trench has a minimum lateral dimension of less than 150 nm, and a depth of the trench is at least 10 nm.

4. The heterostructure of claim 2, wherein:
the interfacial material comprises one or more material layer between the trench material and the substrate; and
the trench lands on one of the one or more of the material layers between the trench material and the substrate.

5. The heterostructure of claim 4, wherein the interfacial material comprises at least one layer having hexagonal or cubic crystalline microstructure, and the interfacial material has a total thickness from an interface of the substrate to an interface of the trench material that is between 10 nm and 2 μm.

6. The heterostructure of claim 5, wherein the interfacial material comprises at least one layer comprising an alloy of AlN, GaN, or AlGaN.

7. The heterostructure of claim 6, wherein:
the interfacial material comprises a plurality of compositionally distinct III-N material layers or one or more compositionally graded III-N material layers.

8. The heterostructure of claim 5, wherein the interfacial material comprises at least one layer comprising an alloy of AlAs, GaAs, AlAs, GaP, or MgO.

9. The heterostructure of claim 1, wherein:
the III-N material comprises at least one layer comprising Ga and N;
the interfacial material comprises one or more material layers between the trench material and the layer comprising Ga and N; and
the one or more material layers line a sidewall of the trench.

10. A crystalline heterostructure, comprising:
a silicon substrate having a first crystallinity;
a trench material over the substrate, the trench material comprising an amorphous material;
an elevated structure comprising III-N material having a second crystallinity, the elevated structure in one or more trench in the trench material, and the III-N material comprising at least one layer comprising Ga and N; and
an interfacial material within the trench between the elevated structure and the substrate, wherein:
the interfacial material comprises at least one of:
an interlayer between the trench material and the substrate; or
an interlayer between the elevated structure and the trench material;

the interfacial material comprises one or more material layers between the trench material and the layer comprising Ga and N; and
the one or more material layers line a sidewall of the trench; and
at least a portion of the interfacial material within the trench has hexagonal microstructure; and
at least a portion of the interfacial material over the trench material has amorphous microstructure.

11. The heterostructure of claim 10, wherein the interfacial material comprises at least one layer comprising an alloy of AlN, an alloy of HfN, an alloy of TiAlN, an alloy of SiC, an alloy of ScN, or an alloy of ZnO, and the interfacial material has a total thickness from an interface of the substrate to an interface of the layer comprising Ga and N that is less than 50 nm.

12. The heterostructure of claim 2, wherein:
the interfacial material is confined within a recess having a footprint of at least 1 μm² in the substrate;
the interfacial material and a bottom of the one or more trenches is recessed below a top surface of the substrate;
the elevated structure has a pair of inclined sidewall facets that are semi-polar planes intersecting the c-plane at angles of 50-80 degrees; and
the elevated structure has a z-height above a top surface of the trench material that is at least $$\frac{\sqrt{3}}{2}$$

times a lateral width of the trench.

13. A semiconductor device, comprising:
the heterostructure of claim 1;
one or more crystalline device layers over the elevated structure; and
one or more device terminals coupled to the one or more device layers.

14. The device of claim 13, wherein:
the elevated structure comprises a III-N crystalline material over the trench material;
the one or more device layers comprises a III-N polarization layer having a different composition than the III-N crystalline material;
a first of the one or more device terminals comprises a gate stack over the III-N polarization layer and a channel region of the at least one of the one or more device layers; and
a source terminal and a drain terminal are coupled to at least one of the one or more device layers on opposite sides of the gate stack.

15. The device of claim 14, wherein:
a fin extending from the trench material comprises the III-N polarization layer and the III-N crystalline material;
the III-N crystalline material of the fin is separated, by one or more amorphous dielectric material, from crystalline or polycrystalline material within the one or more trench.

16. The device of claim 15, wherein:
the substrate surface comprises (100) silicon;
the elevated structure comprises a III-N material island with a c-plane no more than 10° from parallel to the (111) or (100) plane of the substrate;

the one or more trenches comprises two or more parallel first trenches extending in a <113> direction of the substrate surface;

the interfacial layer is confined within a second trench, the second trench comprising a recess in the substrate; and the III-N crystalline material of the fin is between an adjacent pair of the two or more parallel first trenches.

17. The device of claim 13, further comprising:

a silicon-channeled MOSFET over the second region of the substrate surface adjacent to the elevated structure.

18. A method of forming a crystalline heterostructure, the method comprising:

forming one or more trenches in a first region of a substrate having a first crystallinity while a second region of the substrate is protected by an isolation material;

forming an interfacial material at the bottom of the one or more trenches, adjacent to the isolation material;

forming one or more second trenches in a trench material layer over the first region of the substrate; and epitaxially growing an elevated crystalline structure having a second crystallinity over the interfacial material disposed within the one or more second trenches; and growing one or more device layers over the elevated structure.

19. The method of claim 18, wherein:

the substrate surface comprises silicon;

forming the second trenches in the trench material layer further comprises etching into a dielectric layer a pair of trenches exposing the substrate surface within the first region of the substrate; and forming the interfacial material further comprises depositing a liner within the trenches and over an exposed surface of the substrate with a low temperature deposition process not exceeding 700° C.

20. The method of claim 18, wherein:

the substrate surface comprises silicon;

forming the interfacial material further comprises epitaxially growing the interfacial material from the substrate surface with a high temperature process exceeding 700° C.; and forming the trenches in the trench material layer further comprises etching into a dielectric layer a pair of trenches exposing the interfacial material.

21. The method of claim 20, wherein forming the interfacial material further comprises epitaxially growing at least one of a compositionally graded III-N crystalline material, or a plurality of compositionally varied III-N crystalline material layers.

22. The method of claim 18, wherein:

epitaxially growing the elevated structure further comprises laterally growing at least a portion of the structure over the trench material at a rate that favors wurtzite crystal facets non-parallel and non-normal to a c-plane of the elevated structure; and the method further comprises depositing a device terminal over the top surface of the elevated structure parallel to the c-plane.

23. The method of claim 18, wherein:

epitaxially growing the elevated structure within the trenches further comprises epitaxially growing a material layer comprising an alloy of Ga and N;

growing the one or more device layer further comprises growing a III-N polarization layer over the material layer comprising an alloy of Ga and N; and selectively recessing the material layer comprising an alloy of Ga and N to form fins extending from trench material disposed between an adjacent pair of the one or more trenches.

24. The method of claim 23, wherein the method further comprises:

depositing a gate stack over the polarization layer; and forming a source terminal and a drain terminal on opposite sides of the gate stack.

25. The method of claim 24, further comprising forming a MOSFET over a (100) silicon surface in a second region of the substrate adjacent to the crystalline heterostructure, wherein forming the MOSFET further includes:

forming a second gate stack over the (100) silicon surface adjacent to the elevated semiconductor structure; and forming a second source terminal and second drain terminal aligned with the second gate stack along the <110> direction.

* * * * *